(12) United States Patent
Kung et al.

(10) Patent No.: US 11,545,427 B2
(45) Date of Patent: Jan. 3, 2023

(54) CAPACITOR BANK STRUCTURE AND SEMICONDUCTOR PACKAGE STRUCTURE

(71) Applicant: Advanced Semiconductor Engineering, Inc., Kaohsiung (TW)

(72) Inventors: Cheng-Yuan Kung, Kaohsiung (TW); Chien-Hua Chen, Kaohsiung (TW); Teck-Chong Lee, Kaohsiung (TW); Hung-Yi Lin, Kaohsiung (TW); Pao-Nan Lee, Kaohsiung (TW); Hsin Hsiang Wang, Kaohsiung (TW); Min-Tzu Hsu, Kaohsiung (TW); Po-Hao Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/447,839

(22) Filed: Jun. 20, 2019

(65) Prior Publication Data

US 2019/0393297 A1 Dec. 26, 2019

Related U.S. Application Data

(60) Provisional application No. 62/688,927, filed on Jun. 22, 2018.

(51) Int. Cl.
*H01L 23/52* (2006.01)
*H01L 23/522* (2006.01)
(Continued)

(52) U.S. Cl.
CPC ........ *H01L 23/5223* (2013.01); *H01L 21/563* (2013.01); *H01L 21/565* (2013.01); (Continued)

(58) Field of Classification Search
CPC ........... H01L 2924/181; H01L 23/5389; H01L 23/49822; H01L 21/4857; H01L 23/642; (Continued)

(56) References Cited

U.S. PATENT DOCUMENTS 7,532,453 B2 * 5/2009 Yamamoto ............. H01G 4/232
361/306.1
9,991,219 B2 * 6/2018 Seol ........................ H01L 24/25
(Continued)

*Primary Examiner* — Shouxiang Hu
(74) *Attorney, Agent, or Firm* — Foley & Lardner LLP

(57) ABSTRACT

A capacitor bank structure includes a plurality of capacitors, a protection material, a first dielectric layer and a plurality of first pillars. The capacitors are disposed side by side. Each of the capacitors has a first surface and a second surface opposite to the first surface, and includes a plurality of first electrodes and a plurality of second electrodes. The first electrodes are disposed adjacent to the first surface for external connection, and the second electrodes are disposed adjacent to the second surface for external connection. The protection material covers the capacitors, sidewalls of the first electrodes and sidewalls of the second electrodes, and has a first surface corresponding to the first surface of the capacitor and a second surface corresponding to the second surface of the capacitor. The first dielectric layer is disposed on the first surface of the protection material, and defines a plurality of openings to expose the first electrodes. The first pillars are disposed in the openings of the first dielectric layer and protrude from the first dielectric layer.

1 Claim, 44 Drawing Sheets

(51) Int. Cl.
*H01L 49/02* (2006.01)
*H01L 25/16* (2006.01)
*H01L 23/528* (2006.01)
*H01L 23/31* (2006.01)
*H01L 23/00* (2006.01)
*H01L 21/56* (2006.01)

(52) U.S. Cl.
CPC ...... H01L 23/3128 (2013.01); H01L 23/3171 (2013.01); H01L 23/5226 (2013.01); H01L 23/5283 (2013.01); H01L 24/09 (2013.01); H01L 24/17 (2013.01); H01L 25/16 (2013.01); H01L 28/60 (2013.01); *H01L 2224/02373* (2013.01); *H01L 2224/02381* (2013.01); *H01L 2224/0401* (2013.01)

(58) Field of Classification Search
CPC . H01L 23/50; H01L 23/3121; H01L 23/5383; H01L 23/498; H01L 24/96; H01L 23/28; H01L 23/5223; H01L 28/60; H01L 25/16; H01L 23/5226; H01L 23/5283; H01L 23/3128; H01L 24/09; H01L 21/565; H01L 21/563; H01L 23/3171; H01L 24/17; H01L 2224/0401; H01L 2224/02381; H01L 2224/02373; H01L 23/5384; H01L 23/49816; H01L 2225/1041; H01L 2225/1023; H01L 2225/1058; H01L 25/105; H01L 2224/32225; H01L 24/32; H01L 24/19; H01L 24/20; H01L 2224/1712; H01L 2224/1412; H01L 24/16; H01L 2224/16225; H01L 24/14; H01L 24/48; H01L 2924/19104; H01L 2224/73253; H01L 2924/00014; H01L 2224/1403; H01L 2224/17181; H01L 2224/73267; H01L 2224/48091; H01L 2924/15311; H01L 2224/48227; H01L 2224/18; H01L 2221/68345; H01L 2221/68372; H01L 2221/68359; H01L 21/6835; H01L 21/56; H01L 21/568; H01L 23/3135; H05K 1/162; H05K 2201/10159; H05K 2201/10166; H05K 1/185; H01G 4/005; H01G 4/236; H01G 4/33; H01G 4/38
See application file for complete search history.

(56) References Cited

U.S. PATENT DOCUMENTS

| | | |
|---|---|---|
| 10,032,738 B2 | 7/2018 | Park et al. |
| 10,396,044 B2 * | 8/2019 | Nakagawa .............. H01L 25/00 |
| 2011/0157763 A1 * | 6/2011 | Yamamoto ............ H05K 1/185 |
| | | 361/301.3 |
| 2018/0005984 A1 * | 1/2018 | Yu .......................... H01L 25/50 |

* cited by examiner

CAPACITOR BANK STRUCTURE AND SEMICONDUCTOR PACKAGE STRUCTURE

CROSS-REFERENCE TO RELATED APPLICATIONS

This application claims the benefit of and priority to U.S. Provisional Application No. 62/688,927, filed Jun. 22, 2018, the contents of which are incorporated herein by reference in their entirety.

BACKGROUND

1. Field of the Disclosure

The present disclosure relates to a capacitor bank structure and a semiconductor package structure including at least one capacitor, and to a method for manufacturing the same.

2. Description of the Related Art

With the advancement of microelectronics technology, the size of the semiconductor device will become smaller and smaller, which will make the operating voltage of the overall electronic system become lower and lower, and the stability of voltage variation will be a critical issue. To achieve the stability of the voltage variation, more electronic devices (such as decoupling capacitors) should be integrated at the power supply of the electronic system. In addition to provide a more stable power output to the electronic system, the decoupling capacitor can effectively reduce the noise of the electronic device coupled to the power supply; thereby, indirectly reducing the influence of the noise of the electronic device to other electronic device(s), and suppressing undesired radiation. That is, when the power supply of the electronic system is turned off, the voltage surge can be effectively suppressed; and when the power supply of the electronic system is turned on, the voltage drop can also be suppressed.

SUMMARY

In some embodiments, a capacitor bank structure includes a plurality of capacitors, a protection material, a first dielectric layer and a plurality of first pillars. The capacitors are disposed side by side. Each of the capacitors has a first surface and a second surface opposite to the first surface, and includes a plurality of first electrodes and a plurality of second electrodes. The first electrodes are disposed adjacent to the first surface for external connection, and the second electrodes are disposed adjacent to the second surface for external connection. The protection material covers the capacitors, sidewalls of the first electrodes and sidewalls of the second electrodes, and has a first surface corresponding to the first surface of the capacitor and a second surface corresponding to the second surface of the capacitor. The first dielectric layer is disposed on the first surface of the protection material, and defines a plurality of openings to expose the first electrodes. The first pillars are disposed in the openings of the first dielectric layer and protrude from the first dielectric layer.

In some embodiments, a semiconductor package structure includes a conductive structure, a semiconductor device, at least one capacitor, an encapsulant and a plurality of outer pillars. The conductive structure has a top surface and a bottom surface opposite to the top surface. The semiconductor device is electrically connected to the top surface of the conductive structure. The capacitor is disposed between the semiconductor device and the top surface of the conductive structure. The capacitor has a first surface and a second surface opposite to the first surface, and includes a plurality of first electrodes disposed adjacent to the first surface thereof for being electrically connected to the conductive structure and a plurality of second electrodes disposed adjacent to the second surface thereof for being electrically connected to the semiconductor device. The encapsulant covers the semiconductor device and the conductive structure. The outer pillars are disposed around the semiconductor device and extend through the encapsulant.

In some embodiments, a method for manufacturing a semiconductor package structure includes: (a) providing at least one capacitor, an encapsulant and a plurality of outer pillars on a semiconductor device, wherein the capacitor has a first surface and a second surface opposite to the first surface, and includes a plurality of first electrodes disposed adjacent to the first surface thereof and a plurality of second electrodes disposed adjacent to the second surface thereof for being electrically connected to the semiconductor device; the encapsulant covers the semiconductor device; and the outer pillars extend through the encapsulant; and (b) forming a conductive structure on the at least one capacitor, the encapsulant and the outer pillars, wherein the first electrodes of the capacitor are electrically connected to the conductive structure, and the at least one capacitor is disposed between the semiconductor device and the conductive structure.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
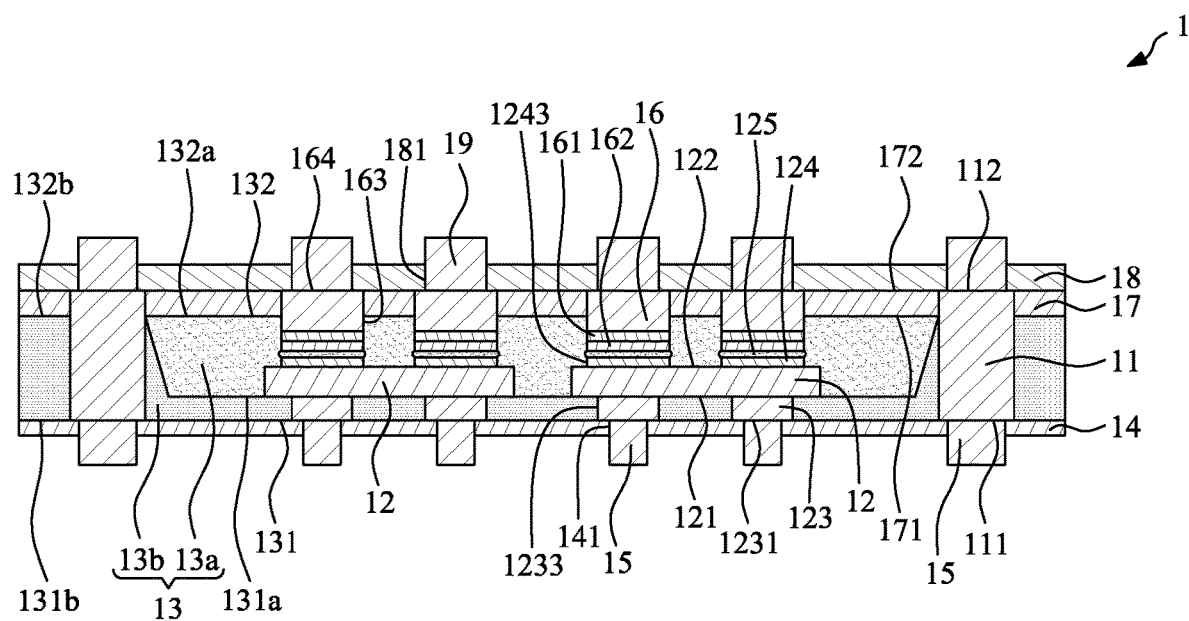
FIG. 1 illustrates a cross-sectional view of a capacitor bank structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative package structure, capacitors, such as decoupling capacitors, may be disposed as close as possible to the semiconductor die or the hot spot so as to increase their effectiveness. That is, the capacitor may be mounted on a side of the semiconductor die, on a land of a substrate, or embedded in a substrate. Such three types are described as follows. In a first type, a capacitor mounted on the side of the semiconductor die is called as a "Die Side Capacitor (DSC)". The capacitor and the semiconductor die are mounted to the substrate side by side. Although the DSC is readily packaged, the disadvantage is that the current path is too long and wastes an excessive area. In a second type, the capacitor embedded inside the substrate is called the "Embedded Capacitor (ECC)". Although the ECC has a better performance than the DSC, a thickness of the substrate that accommodates the ECC is relatively great. Further, the assembling cost of ECC may be relatively high. In a third type, a capacitor mounted on the land pad of the bottom surface of the substrate is called the "Land Side Capacitor (LSC)". Although there is no thickness and cost issue with the LSC compared to the ECC, the LSC reduces the number of solder balls. Further, the LSC increases the size of the solder ball.

At least some embodiments of the present disclosure provide for a semiconductor package structure which includes at least one capacitor disposed between a semiconductor device and a conductive structure. Thus, the decoupling loop is shortened, and the ball mount area of the bottom surface of the conductive structure is increased.

FIG. 1 illustrates a cross-sectional view of a capacitor bank structure 1 according to some embodiments of the present disclosure. The capacitor bank structure 1 may include one or more capacitors 12, a protection material 13 (for example, including a first protection material 13a and a second protection material 13b), a first dielectric layer 14, a plurality of first pillars 15, a plurality of conductive pads 16, a second dielectric layer 17, a third dielectric layer 18, a plurality of second pillars 19 and a plurality of conductive pillars 11.

The capacitors 12 are disposed side by side. The capacitor 12 may be a double-sided decoupling capacitor or a single-sided decoupling capacitor. As shown in FIG. 1, each of the capacitors 12 is a double-sided decoupling capacitor, and has a first surface 121 and a second surface 122 opposite to the first surface 121, and includes a plurality of first electrodes 123 and a plurality of second electrodes 124. The first electrodes 123 are disposed adjacent to the first surface 121 of the capacitor 12 for external connection, and the second electrodes 124 are disposed adjacent to the second surface 122 of the capacitor 12 for external connection. That is, both sides (e.g., the first surface 121 and the second surface 122) of the capacitor 12 can be used for electrical connection. Further, the first surface 121 is electrically connected to the second surface 122. Thus, the first electrodes 123 on the first surface 121 may be electrically connected to the second electrodes 124 on the second surface 122. It is noted that a number of the first electrodes 123 may be equal to or different from a number of the second electrodes 124. In addition, each of the first electrodes 123 has a first surface 1231 and a sidewall 1233, and each of the second electrodes 124 has a sidewall 1243. A thickness of each of the capacitors 12 may be less than 50 μm, or less than 30 μm.

The conductive pads 16 are electrically connected to the second electrodes 124 of the capacitor 12. In some embodiments, the conductive pad 16 may be a copper layer, may further include at least one surface finish layer (e.g., a Ni layer 161 and an Au layer 162). The Au layer 162 of the surface finish layer of the conductive pad 16 is connected or bonded to the second electrode 124 of the capacitor 12 through a solder layer 125. As shown in FIG. 1, each of the conductive pads 16 has a second surface 164 and a sidewall 163.

The protection material 13 covers the capacitors 12, the sidewalls 1233 of the first electrodes 123, the sidewalls 1243 of the second electrode 124 and the sidewalls 163 of the conductive pads 16. As shown in FIG. 1, the protection material 13 may be interposed between the first dielectric layer 14 and the second dielectric layer 17. The protection material 13 and has a first surface 131 corresponding to the first surface 121 of the capacitor 12 and a second surface 132 corresponding to the second surface 122 of the capacitor 12. The first surface 131 of the protection material 13 may contact the first dielectric layer 14, and the second surface 132 of the protection material 13 may contact the second dielectric layer 17. In some embodiments, the protection material 13 may include an underfill and/or a molding compound. As shown in FIG. 1, the protection material 13 may include a first protection material 13a and a second protection material 13b. The first protection material 13a covers the capacitors 12, the sidewalls 1243 of the second electrode 124 and the sidewalls 163 of the conductive pads 16. The second protection material 13b covers the first protection material 13b and the sidewalls 1233 of the first electrodes 123. A material of the first protection material 13a may be same as or different from a material of the second protection material 13b. In some embodiments, the material of the first protection material 13a may be underfill, and the material of the second protection material 13b may be molding compound 13b. The first protection material 13a may have a first surface 131a and a second surface 132a opposite to the first surface 131a. The first surface 131a of the first protection material 13a may substantially coplanar with the first surfaces 121 of the capacitors 12. The second protection material 13b may have a first surface 131b and a second surface 132b opposite to the first surface 131b. A portion of the second protection material 13b is disposed between the first surface 131a of the first protection material 13a and the first dielectric layer 14. The first surface 131b of the second protection material 13b is the first surface 131 of the protection material 13. The second surface 132b of the second protection material 13b and the second surface 132a of the first protection material 13a constitute the second surface 132 of the protection material 13.

The conductive pillars 11 are disposed around the capacitors 12 and extending through the protection material 13. As shown in FIG. 1, the conductive pillars 11 are disposed around the capacitors 12 and the first protection material 13a of the protection material 13, and extend through the second protection material 13b of the protection material 13. The conductive pillars 11 may be disposed between the first dielectric layer 14 and the third dielectric layer 18, and extend through the second dielectric layer 17. Each of the conductive pillars 11 has a first surface 111 and a second surface 112 opposite to the first surface 111. As shown in FIG. 1, the first surfaces 1231 of the first electrodes 123, the first surfaces 111 of the conductive pillars 11 and the first surface 131 of the protection material 13 are substantially coplanar with each other.

The first dielectric layer 14 (e.g., a passivation layer) is disposed on the first surface 131 of the protection material 13, and defines a plurality of openings 141 to expose the first electrodes 123 and the conductive pillars 11. The first dielectric layer 14 may include, or be formed from, a photoresist layer, a cured photo sensitive material, a cured photoimageable dielectric (PID) material such as epoxy or polyimide (PI) including photoinitiators, or a combination of two or more thereof. The first pillars 15 are disposed in the openings 141 of the first dielectric layer 14 and protrude from the first dielectric layer 14. Thus, the first pillars 15 contact the first surfaces 1231 of the first electrodes 123 and the first surfaces 111 of the conductive pillars 11.

The second dielectric layer 17 (e.g., a passivation layer) is disposed on the second surface 132 of the protection material 13, and covers the sidewalls 163 of the conductive pads 16 and the sidewalls of the conductive pillars 11. The second dielectric layer 17 has a first surface 171 and a second surface 172 opposite to the first surface 171. As shown in FIG. 1, the second surface 164 of the conductive pad 16, the second surface 112 of the conductive pillars 11 and the second surface 172 of the second dielectric layer 17 are substantially coplanar with each other. The second dielectric layer 17 may include, or be formed from, a photoresist layer, a cured photo sensitive material, a cured photoimageable dielectric (PID) material such as epoxy or polyimide (PI) including photoinitiators, or a combination of two or more thereof.

The third dielectric layer 18 (e.g., a passivation layer) is disposed on the second dielectric layer 17, and defines a plurality of openings 181 to expose the conductive pads 16 and the conductive pillars 11. The third dielectric layer 18 may include, or be formed from, a photoresist layer, a cured photo sensitive material, a cured photoimageable dielectric (PID) material such as epoxy or polyimide (PI) including photoinitiators, or a combination of two or more thereof. The second pillars 19 are disposed in the openings 181 of the third dielectric layer 18 and protrude from the third dielectric layer 18. Thus, the second pillars 19 contact the second surfaces 164 of the conductive pads 16 and the second surfaces 112 of the conductive pillars 11. As shown in FIG. 1, some of the second pillar 19 can be electrically connected to some of the first pillar 15 through the conductive pads 16, the Ni layers 161, the Au layers 162, the solder layers 125, the second electrodes 124, the capacitors 12 and the first electrodes 123. In addition, some of the second pillar 19 can be electrically connected to some of the first pillar 15 through the conductive pillars 11.

Figure 2:
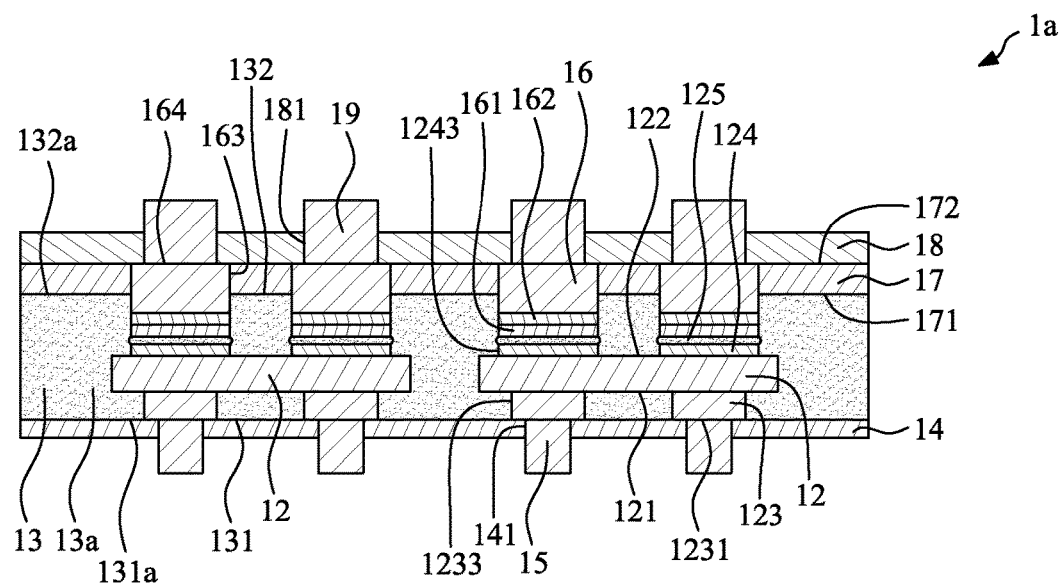
FIG. 2 illustrates a cross-sectional view of a capacitor bank structure according to some embodiments of the present disclosure.

FIG. 2 illustrates a cross-sectional view of a capacitor bank structure 1a according to some embodiments of the present disclosure. The capacitor bank structure 1a of FIG. 2 may be similar to the capacitor bank structure 1 of FIG. 1 except that the conductive pillars 11 are omitted and the protection material 13 may solely include the first protection material 13a or the second protection material 13b. As shown in FIG. 2, the first surface 131a of the first protection material 13a is the first surface 131 of the protection material 13, and the second surface 132a of the first protection material 13a is the second surface 132 of the protection material 13.

Figure 3:
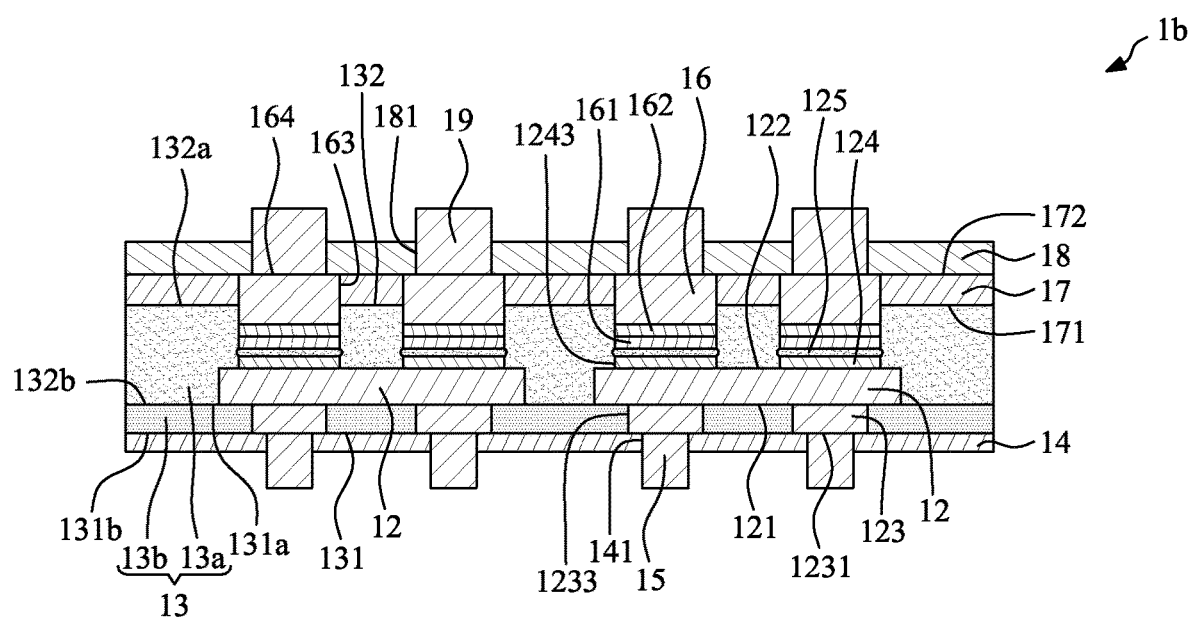
FIG. 3 illustrates a cross-sectional view of a capacitor bank structure according to some embodiments of the present disclosure.

FIG. 3 illustrates a cross-sectional view of a capacitor bank structure 1b according to some embodiments of the present disclosure. The capacitor bank structure 1b of FIG. 3 may be similar to the capacitor bank structure 1 of FIG. 1 except that the conductive pillars 11 are omitted. As shown in FIG. 3, the second surface 132b of the second protection material 13b is disposed on the first surface 131a of the first protection material 13a. The first surface 131b of the second protection material 13b is the first surface 131 of the protection material 13, and the second surface 132a of the first protection material 13a is the second surface 132 of the protection material 13.

Figure 4:
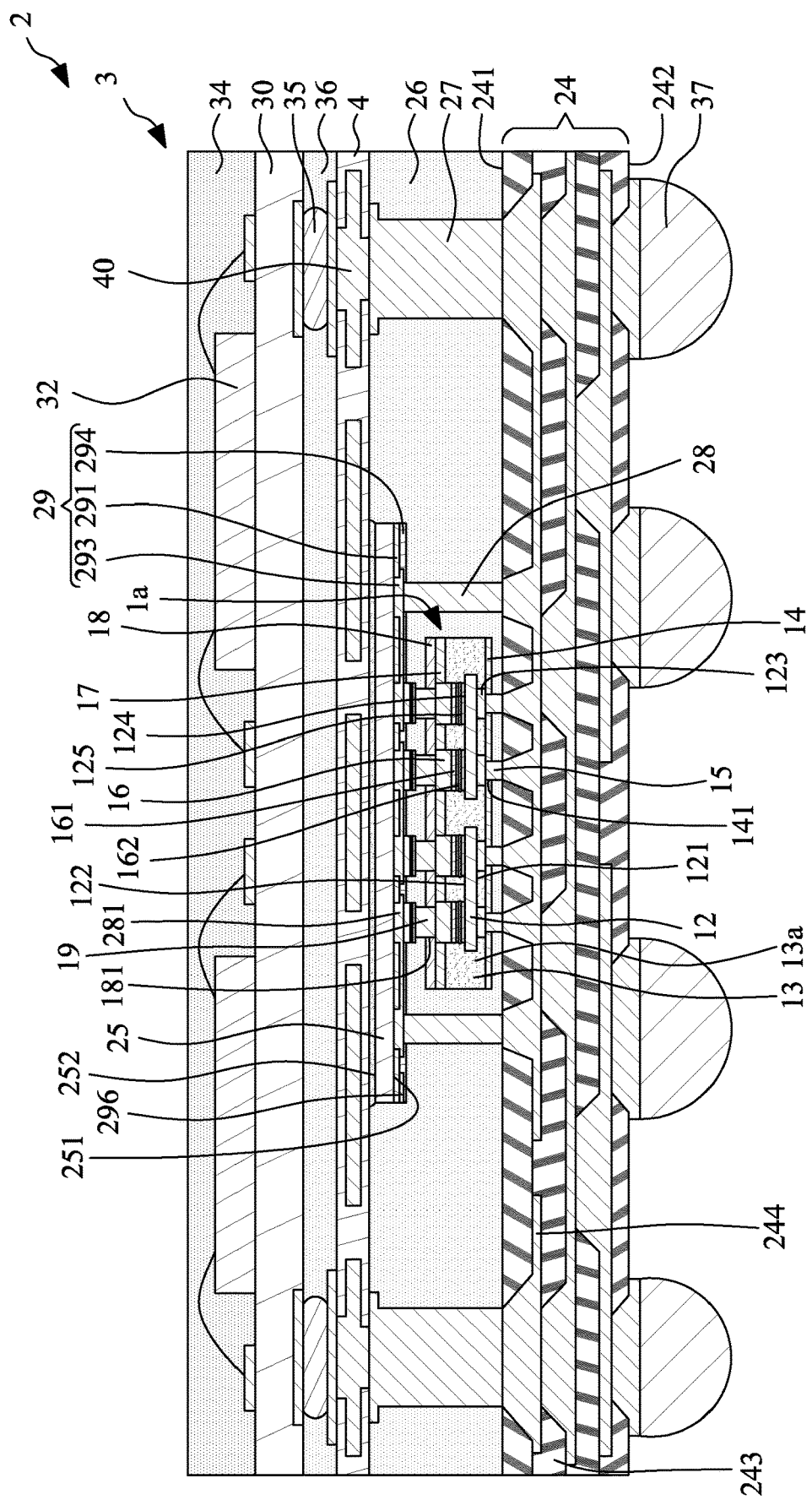
FIG. 4 illustrates a cross-sectional view of a semiconductor package structure according to some embodiments of the present disclosure.

FIG. 4 illustrates a cross-sectional view of a semiconductor package structure 2 according to some embodiments of the present disclosure. The semiconductor package structure 2 includes a conductive structure 24, a semiconductor device 25, one or more capacitors 12, an encapsulant 26, a plurality of outer pillars 27, a top package 3, a plurality of inner pillars 28, a redistribution circuit structure 29, a wiring structure 4 and a plurality of solder bumps 37.

The conductive structure 24 may be a substrate or an interposer, and may have a top surface 241 and a bottom surface 242 opposite to the top surface 241. In some embodiments, the conductive structure 24 may include four dielectric layers 243 (e.g., four passivation layers) and four metal circuit layers 244 electrically connected to one another. The semiconductor device 25 may be a semiconductor logic die such as a CPU (Central Processing Unit), a GPU (Graphics Processing Unit) or an AP (Application Processor), and may be electrically connected to the top surface 241 of the conductive structure 24. As shown in FIG. 4, the semiconductor device 25 has a first surface 251 and a second surface 252 opposite to the first surface 241. The first surface 251 of the semiconductor device 25 is electrically connected to the top surface 241 of the conductive structure 24 through the redistribution circuit structure 29, the capacitor bank structure 1a, and the inner pillars 28. The second surface 252 of the semiconductor device 25 is adhered to the wiring structure 4. The capacitor bank structure 1a may be the same as the capacitor bank structure 1a of FIG. 2, and may include one or more capacitors 12. Thus, the capacitors 12 are disposed between the first surface 251 of the semiconductor device 25 and the top surface 241 of the conductive structure 24. The first electrodes 123 are electrically connected to the conductive structure 24. The second electrodes 124 are electrically connected to the semiconductor device 25 through the solder layers 125, the Ni layers 161, the Au layers 162, the conductive pads 16, the second pillars 19, the conductive pads 281 and the redistribution circuit structure 29. The capacitors 12 are not embedded in the conductive structure 24. An area of the capacitor bank structure 1a from a top view is less than an area of the semiconductor device 25 from a top view. The inner pillars 28 are disposed outside the capacitor bank structure 1a and electrically connected to the semiconductor device 25 and the conductive structure 24.

The redistribution circuit structure 29 (for example, including a first passivation layer 291, a second passivation layer 294 and a redistribution layer (RDL) 293) is disposed between the semiconductor device 25 and the capacitor bank structure 1a (including the capacitors 12). A size of the redistribution circuit structure 29 may be substantially equal to a size of the semiconductor device 25. The inner pillars 28 may stand on the redistribution circuit structure 29. Further, the redistribution layer (RDL) 293 may include a fiducial mark 296. However, in some embodiments, the redistribution circuit structure 29 may be omitted.

The encapsulant 26 is disposed in the space between the wiring structure 4 and the conductive structure 24 to cover the semiconductor device 25, the capacitor bank structure 1a (including the capacitors 12), the conductive structure 24, the inner pillars 28 and the redistribution circuit structure 29. A material of the encapsulant 26 may be a molding compound.

The outer pillars 27 are disposed around the semiconductor device 25 and extend through the encapsulant 26 to electrically connect the wiring structure 4 and the conductive structure 24. The wiring structure 4 is disposed between the encapsulant 26 and the top package 3. The wiring structure 4 includes at least one dielectric layer and at least one circuit layer 40. However, in some embodiments, the wiring structure 4 may be omitted.

The top package 3 is electrically connected to the outer pillars 27 and the semiconductor device 25 through the inner solders 35 and the wiring structure 4. In one embodiment, the top package 3 includes a top substrate 30, one or more memory dice 32 and a top encapsulant 34. The memory die 32 may be a synchronous random access memory (SRAM), a dynamic random access memory (DRAM), a low power DDR (LPDDR) or a high bandwidth memory (HBM). The memory dice 32 are electrically connected to the top substrate 30 by wire bonding. However, the memory dice 32 may be electrically connected to the top substrate 30 by flip-chip bonding. The top encapsulant 34 covers the more memory dice 32 and the top substrate 30. In addition, a middle encapsulant 36 may be included in the space between the top substrate 30 and the wiring structure 4 to cover and protect the inner solders 35. Further, the solder bumps 37 are disposed on the second surface 242 of the conductive structure 24 for external connection.

In the semiconductor package structure 2 illustrated in FIG. 4, the capacitors 12 are disposed between the semiconductor device 25 and the conductive structure 24. Thus, the decoupling loop is shortened. Further, the ball mount area of the second surface 242 of the conductive structure 24 is increased since the capacitors 12 are not attached to the second surface 242 of the conductive structure 24. That is, there can be more solder bumps 37 disposed on the second surface 242 of the conductive structure 24. Furthermore, the quantity of the capacitors 12 can be increased. In addition, the capacitor bank structure 1a is a reconstitution structure, which can reduce the manufacturing time of the semiconductor package structure 2 and improve the yield of the semiconductor package structure 2.

Figure 5:
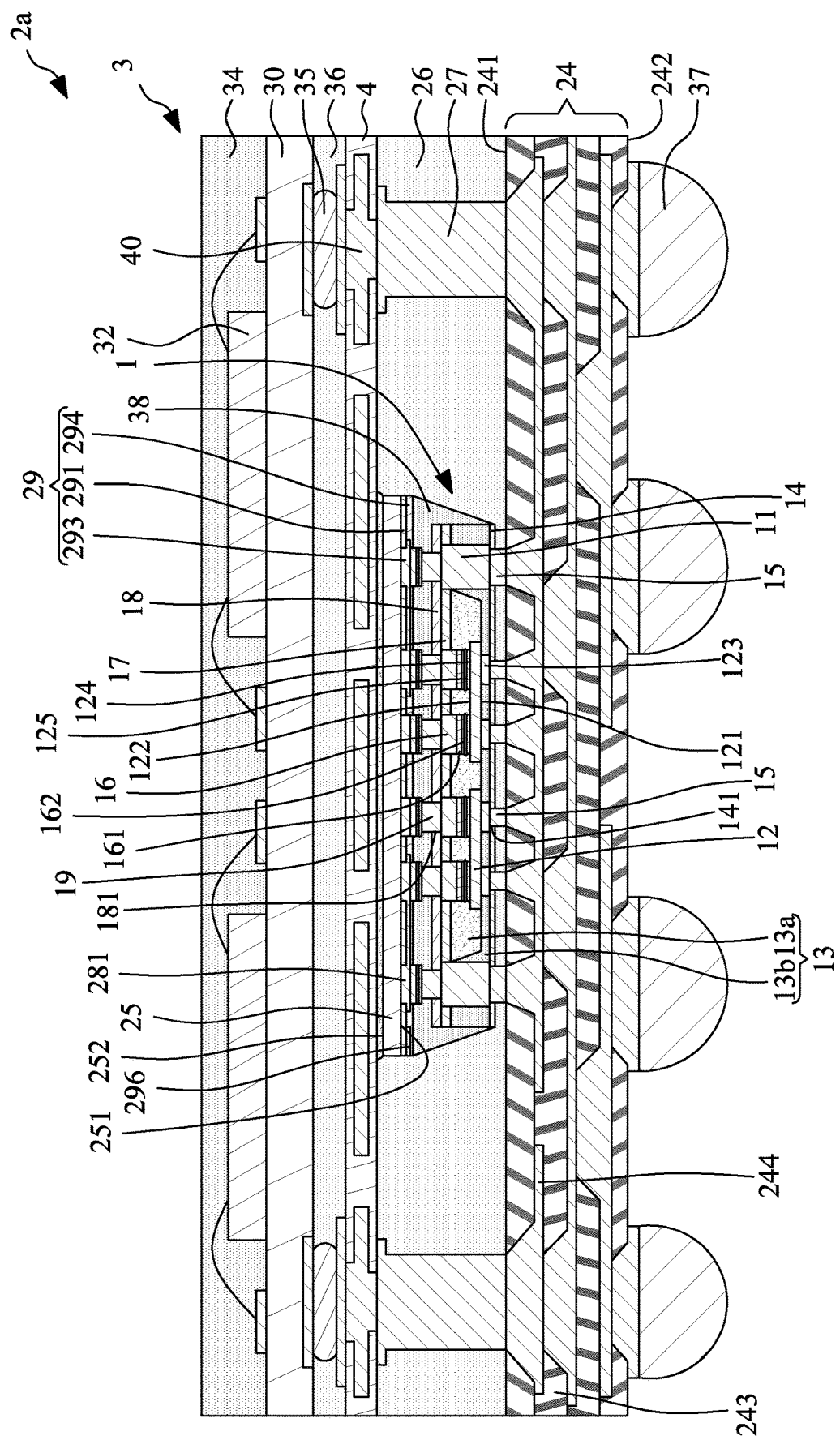
FIG. 5 illustrates a cross-sectional view of a semiconductor package structure according to some embodiments of the present disclosure.

FIG. 5 illustrates a cross-sectional view of a semiconductor package structure 2a according to some embodiments of the present disclosure. The semiconductor package structure 2a of FIG. 5 may be similar to the semiconductor package structure 2 of FIG. 4 except that the capacitor bank structure 1a is replaced by the capacitor bank structure 1 of FIG. 1, and the inner pillars 28 are omitted. As shown in FIG. 5, the area of the capacitor bank structure 1a from a top view is substantially equal to the area of the semiconductor device 25 from a top view. Thus, the inner pillars 28 of FIG. 4 are not necessary, and the conductive pillars 11 of the capacitor bank structure 1 are electrically connected to the redistribution circuit structure 29 (or the semiconductor device 25) and the conductive structure 24. In addition, an underfill 38 is formed between the space between the capacitor bank structure 1 and the redistribution circuit structure 29 (or the semiconductor device 25) to cover and protect the joint structure between the capacitor bank structure 1 and the redistribution circuit structure 29 (or the semiconductor device 25). The area of the underfill 38 from a top view is substantially equal to the area of the semiconductor device 25 from a top view.

Figure 6:
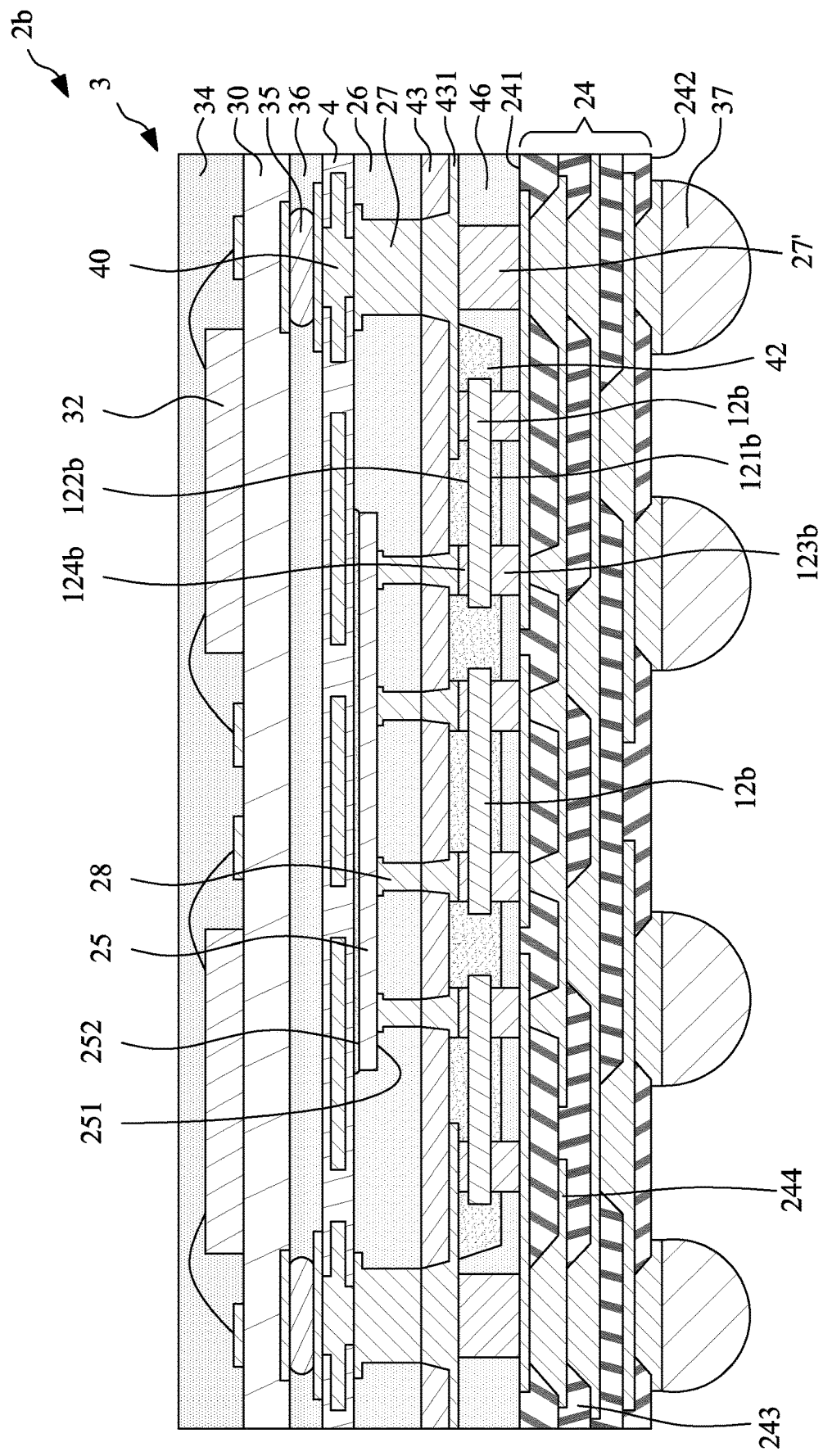
FIG. 6 illustrates a cross-sectional view of a semiconductor package structure according to some embodiments of the present disclosure.

FIG. 6 illustrates a cross-sectional view of a semiconductor package structure 2b according to some embodiments of the present disclosure. The semiconductor package structure 2b of FIG. 6 may be similar to the semiconductor package structure 2 of FIG. 4, and the differences are described as follows. The inner pillars 28 are disposed on the first surface 251 of the semiconductor device 25. A middle redistribution structure 43 (including a redistribution layer (RDL) 431) is disposed on the encapsulant 26 to electrically connect the inner pillars 28 and the outer pillars 27. The capacitors 12 are disposed on and electrically connected to the redistribution layer (RDL) 431 of the middle redistribution structure 43. Each of the capacitors 12b is a double-sided decoupling capacitor, and has a first surface 121b and a second surface 122b opposite to the first surface 121b, and includes a plurality of first electrodes 123b and a plurality of second electrodes 124b. The first electrodes 123b are disposed adjacent to the first surface 121b of the capacitor 12b for external connection, and the second electrodes 124b are disposed adjacent to the second surface 122b of the capacitor 12b for external connection. That is, both sides (e.g., the first surface 121b and the second surface 122b) of the capacitor 12b can be used for electrical connection. A bottom protection material 42 (e.g., an underfill) is disposed on the middle redistribution structure 43 to cover and protect the capacitors 12. It is noted that an area of the bottom protection material 42 from a top view is greater than the area of the semiconductor device 25 from a top view. An insulation layer 46 is formed or disposed on the middle redistribution structure 43 to cover the bottom protection material 42 and the sidewalls of the first electrodes 123b of the capacitors 12b. The conductive structure 24 is disposed on the insulation layer 46 and electrically connected to the first electrodes 123b of the capacitors 12b. In addition, a plurality of outer pillars 27' are disposed around the capacitors 12b and the bottom protection material 42, and electrically connect the middle redistribution structure 43 and the conductive structure 24.

Figure 7:
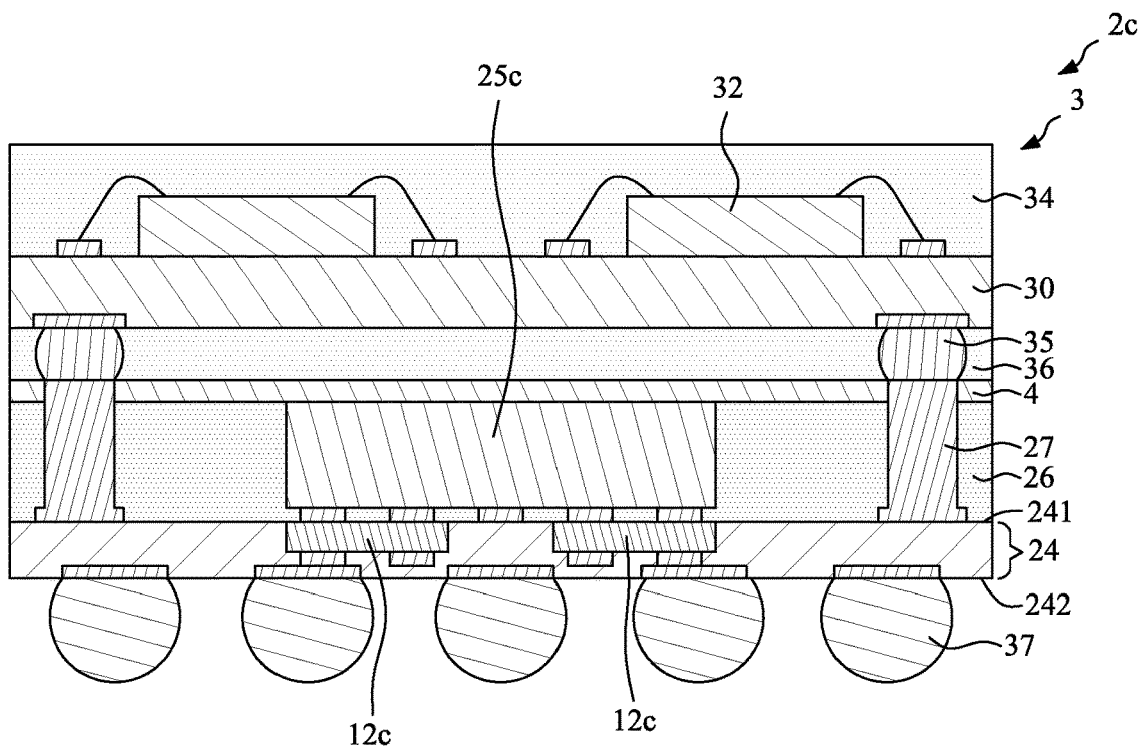
FIG. 7 illustrates a cross-sectional view of a semiconductor package structure according to some embodiments of the present disclosure.

FIG. 7 illustrates a cross-sectional view of a semiconductor package structure 2c according to some embodiments of the present disclosure. The semiconductor package structure 2c of FIG. 7 may be similar to the semiconductor package structure 2 of FIG. 4 except for the position of the capacitors 12c. As shown in FIG. 7, the capacitors 12c are embedded in the conductive structure 24. In addition, a thickness of the semiconductor device 25c may be substantially equal to a height of the outer pillar 27.

Figure 8:
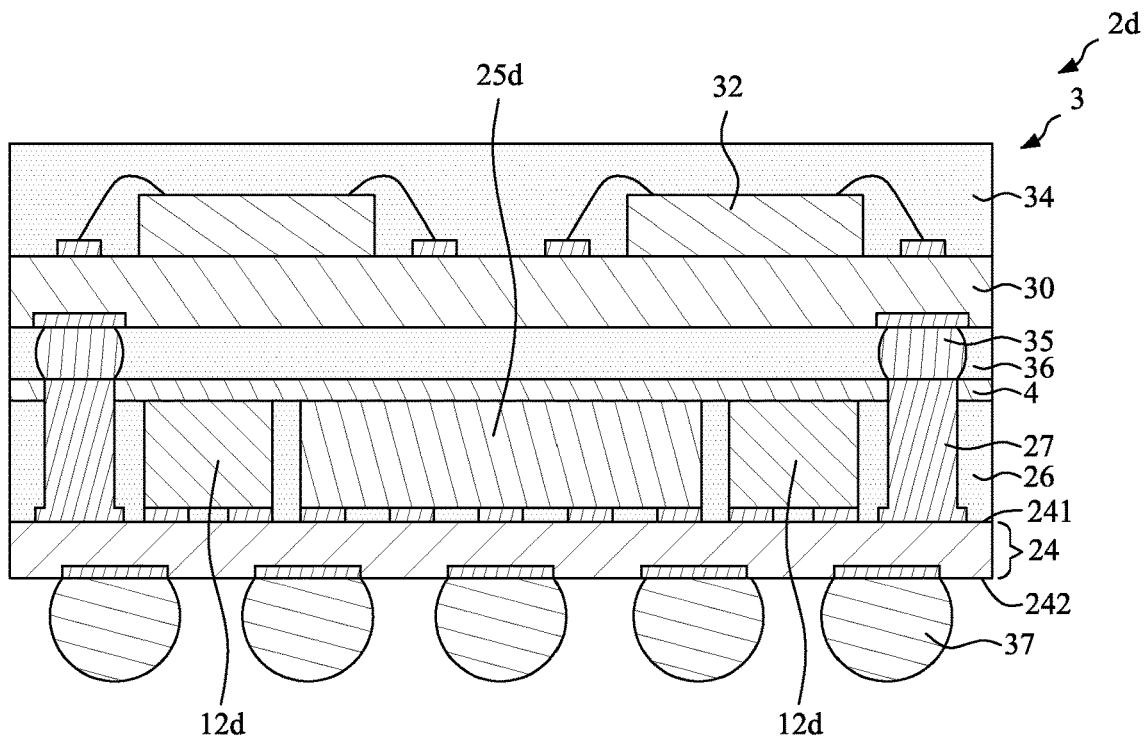
FIG. 8 illustrates a cross-sectional view of a semiconductor package structure according to some embodiments of the present disclosure.

FIG. 8 illustrates a cross-sectional view of a semiconductor package structure 2d according to some embodiments of the present disclosure. The semiconductor package structure 2d of FIG. 8 may be similar to the semiconductor package structure 2 of FIG. 4 except for the position of the capacitors 12d. As shown in FIG. 8, the capacitors 12d are disposed between the conductive structure 24 and the wiring structure 4. The capacitors 12d are disposed around the semiconductor device 25d. That is, the capacitors 12d and the semiconductor device 25d are disposed side by side. A thickness of the semiconductor device 25d, a thickness of the capacitor 12d and a height of the outer pillar 27 may be substantially equal to one another.

Figure 9:
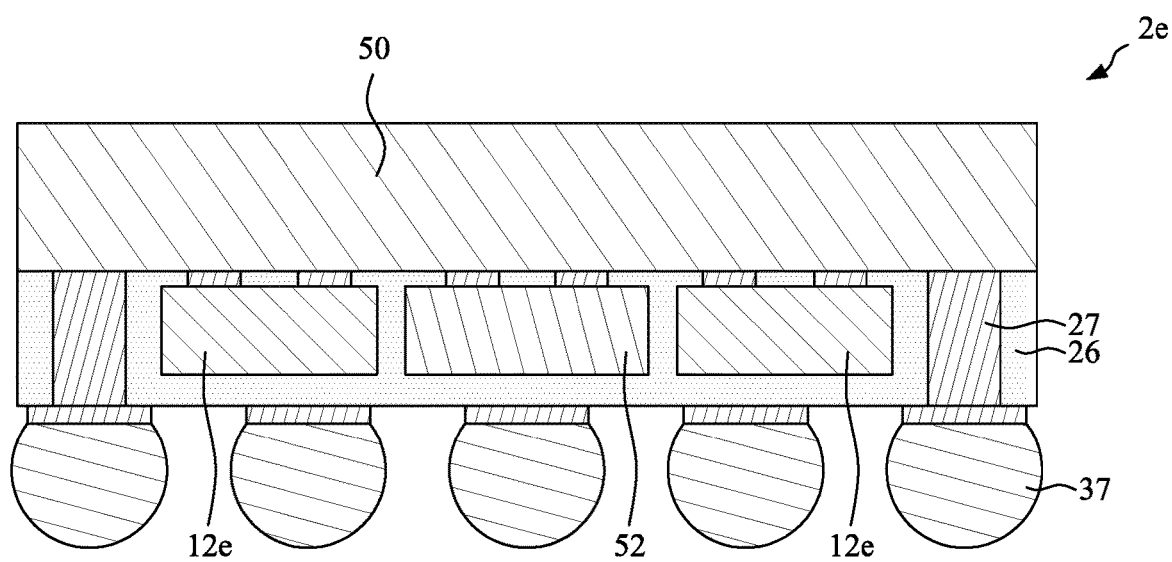
FIG. 9 illustrates a cross-sectional view of a semiconductor package structure according to some embodiments of the present disclosure.

FIG. 9 illustrates a cross-sectional view of a semiconductor package structure 2e according to some embodiments of the present disclosure. The semiconductor package structure 2e includes a photo die (P-Die) 50, an electrical die (E-Die) 52, a plurality of capacitors 12e, a plurality of outer pillars 27, an encapsulant 26 and a plurality of solder bumps 37. The electrical die (E-Die) 52, the capacitors 12e and the outer pillars 27 are electrically connected to a bottom surface of the photo die (P-Die) 50. That is, the electrical die (E-Die) 52 and the capacitors 12e are disposed side by side. The outer pillars 27 are disposed around the electrical die (E-Die) 52 and the capacitors 12e. The encapsulant 26 covers the bottom surface of the photo die (P-Die) 50, the electrical die (E-Die) 52, the capacitors 12e and the outer pillars 27. The outer pillars 27 extend through the encapsulant 26 and are exposed from the bottom surface of the encapsulant 26. The solder bumps 37 are disposed on the bottom surface of the encapsulant 26 and electrically connected to the outer pillars 27.

Figure 10:
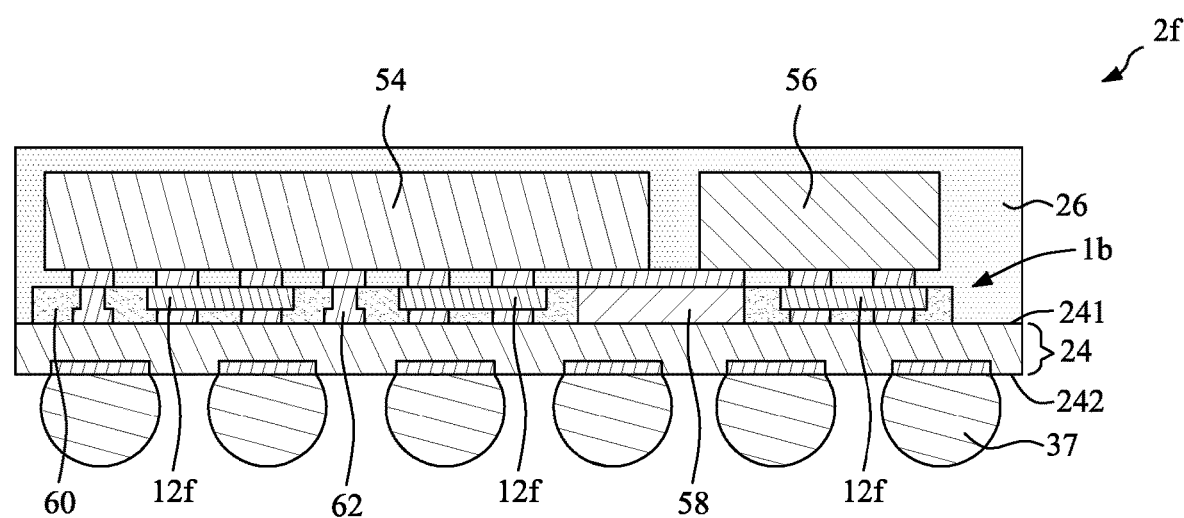
FIG. 10 illustrates a cross-sectional view of a semiconductor package structure according to some embodiments of the present disclosure.

FIG. 10 illustrates a cross-sectional view of a semiconductor package structure 2f according to some embodiments of the present disclosure. The semiconductor package structure 2f includes a conductive structure 24, a capacitor bank structure 1b, a semiconductor device 54, a memory die 56, an encapsulant 26 and a plurality of solder bumps 37. The capacitor bank structure 1b are disposed on or electrically connected to the first surface 241 of the conductive structure 24. The capacitor bank structure 1b may include a plurality of capacitors 12f, a bridge die 58, a plurality of pillars 62 and a protection material 60. The capacitors 12f and the bridge die 58 are disposed side by side and covered by the protection material 60. The pillars 62 extend through the protection material 60. The semiconductor device 54 and the memory die 56 are disposed on the capacitor bank structure 1b, and electrically connected to the capacitors 12f and the bridge die 58. Thus, the capacitor bank structure 1b is disposed between the semiconductor device 54 and the memory die 56, and the conductive structure 24. The semiconductor device 54 is electrically connected to the memory die 56 through the bridge die 58. The encapsulant 26 covers the first surface 241 of the conductive structure 24, the capacitor bank structure 1b, the semiconductor device 54 and the memory die 56. The solder bumps 37 are disposed on the second surface 242 of the conductive structure 24.

Figure 11:
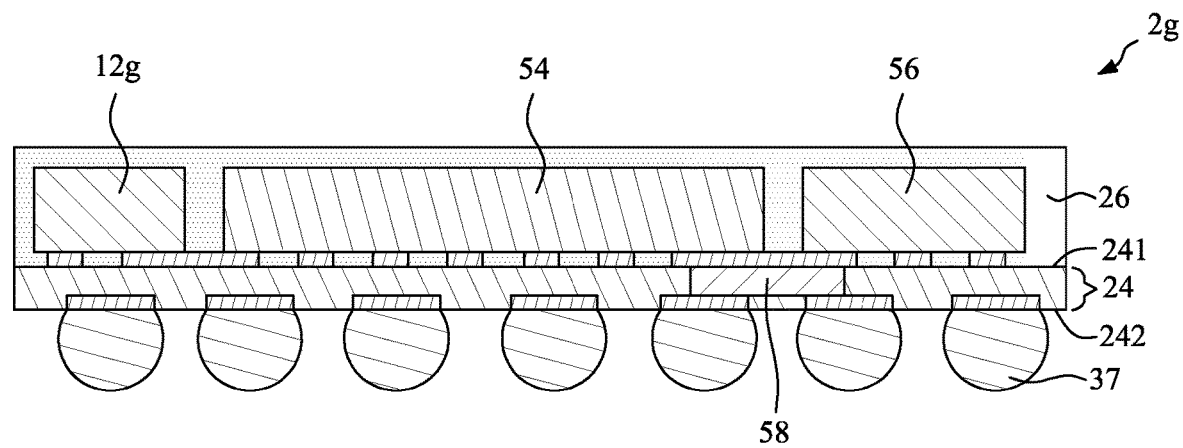
FIG. 11 illustrates a cross-sectional view of a semiconductor package structure according to some embodiments of the present disclosure.

FIG. 11 illustrates a cross-sectional view of a semiconductor package structure 2g according to some embodiments of the present disclosure. The semiconductor package structure 2g of FIG. 11 may be similar to the semiconductor package structure 2f of FIG. 10 except for the position of the capacitors 12g and the bridge die 58. As shown in FIG. 11, the bridge die 58 is embedded in the conductive structure 24, and the capacitors 12g are disposed on or electrically connected to the first surface 241 of the conductive structure 24. The encapsulant 26 covers the first surface 241 of the conductive structure 24, the capacitors 12g, the semiconductor device 54 and the memory die 56.

Figure 12:
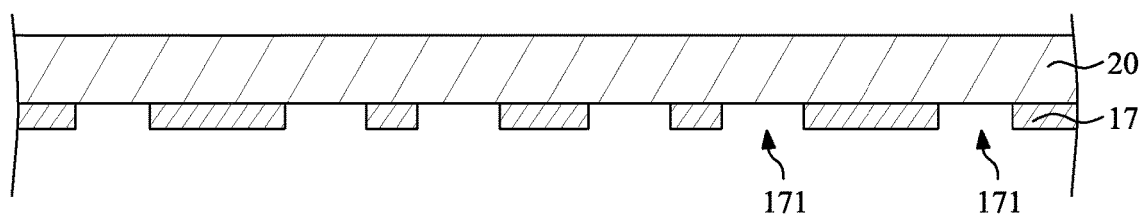
FIG. 12 illustrates one or more stages of an example of a method for manufacturing a capacitor bank structure according to some embodiments of the present disclosure.

FIG. 12 through FIG. 22 illustrate a method for manufacturing a capacitor bank structure according to some embodiments of the present disclosure. In some embodiments, the method is for manufacturing the capacitor bank structure 1 shown in FIG. 1. Referring to FIG. 12, a first supporting carrier 20 and a second dielectric layer 17 are provided. The second dielectric layer 17 is disposed on the first supporting carrier 20, and defines a plurality of openings 171.

Figure 13:
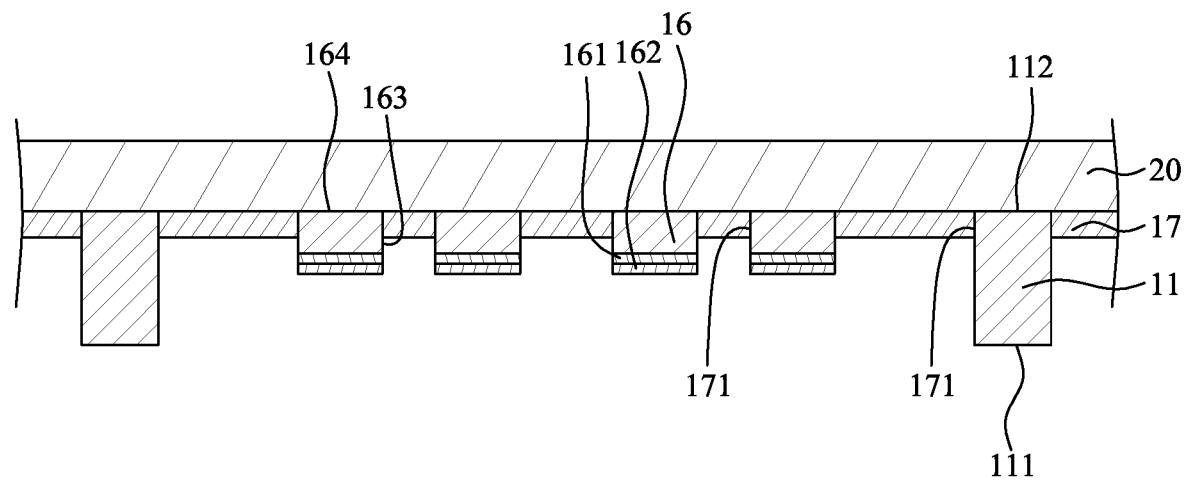
FIG. 13 illustrates one or more stages of an example of a method for manufacturing a capacitor bank structure according to some embodiments of the present disclosure.

Referring to FIG. 13, a plurality of conductive pads 16 and a plurality of conductive pillars 11 are formed in the openings 171 of the second dielectric layer 17. The conductive pad 16 may include at least one surface finish layer (e.g., a Ni layer 161 and an Au layer 62) on the end surface thereof. As shown in FIG. 13, each of the conductive pads 16 has a second surface 164 and a sidewall 163.

Figure 14:
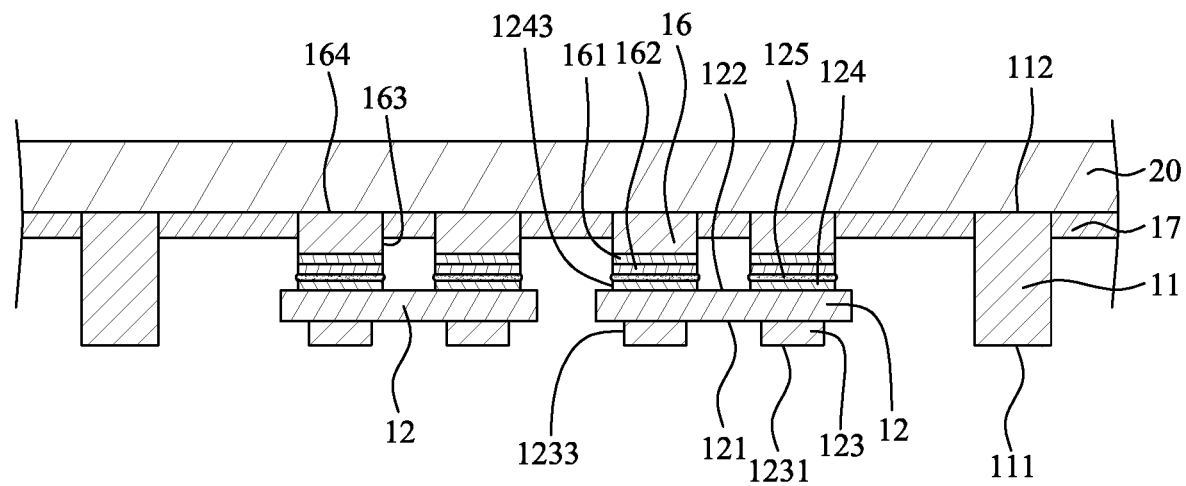
FIG. 14 illustrates one or more stages of an example of a method for manufacturing a capacitor bank structure according to some embodiments of the present disclosure.

Referring to FIG. 14, one or more capacitors 12 are electrically connected to the conductive pads 16. The capacitor 12 may be a double-sided decoupling capacitor. The capacitor 12 has a first surface 121 and a second surface 122 opposite to the first surface 121, and includes a plurality of first electrodes 123 and a plurality of second electrodes 124. The first electrodes 123 are disposed adjacent to the first surface 121 of the capacitor 12, and the second electrodes 124 are disposed adjacent to the second surface 122 of the capacitor 12. The second electrode 124 of the capacitor 12 is connected to the surface finish layer (e.g., a Ni layer 161 and an Au layer) of the conductive pad 16 through a solder layer 125. In addition, each of the first electrodes 123 has a first surface 1231 and a sidewall 1233, and each of the second electrodes 124 has a sidewall 1243.

Figure 15:
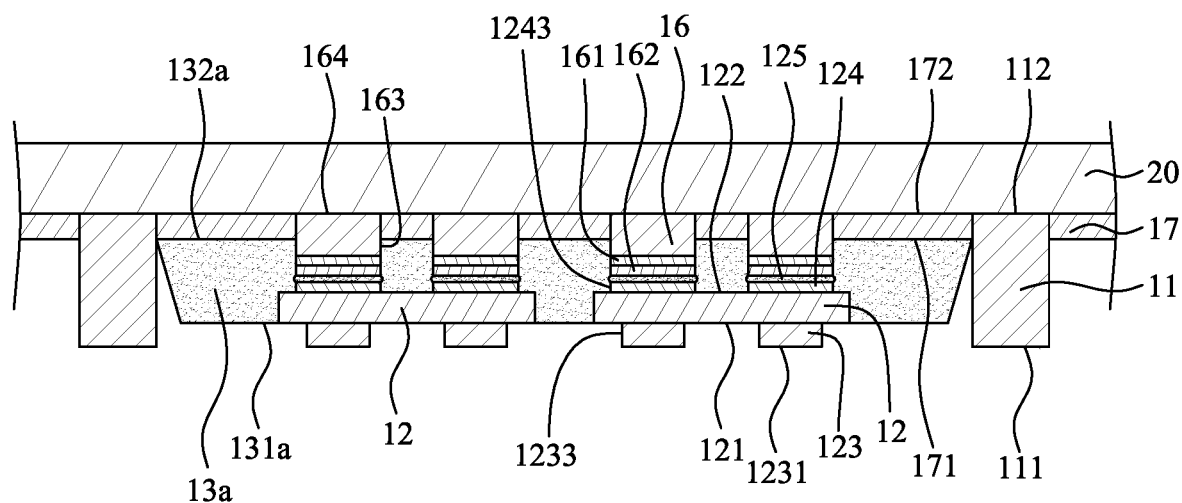
FIG. 15 illustrates one or more stages of an example of a method for manufacturing a s capacitor bank structure according to some embodiments of the present disclosure.
Figure 16:
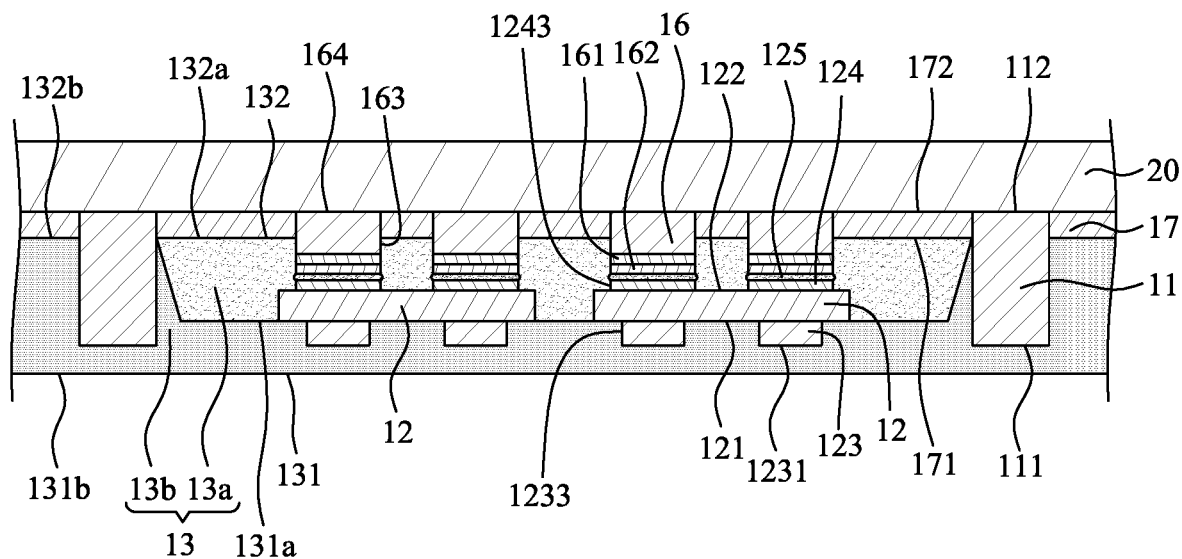
FIG. 16 illustrates one or more stages of an example of a method for manufacturing a capacitor bank structure according to some embodiments of the present disclosure.

Referring to FIG. 15 and FIG. 16, a protection material 13 (for example, including a first protection material 13a and a second protection material 13b) is formed to cover the capacitors 12, the sidewalls 1233 of the first electrodes 123, the sidewalls 1243 of the second electrode 124 and the sidewalls 163 of the conductive pads 16. Referring to FIG. 15, the first protection material 13a is formed to cover the capacitors 12, the sidewalls 1243 of the second electrode 124 and the sidewalls 163 of the conductive pads 16. Referring to FIG. 16, the second protection material 13b is formed to cover the first protection material 13a and the sidewalls 1233 of the first electrodes 123 and the sidewalls of the conductive pillars 11. The protection material 13 (including the first protection material 13a and the second protection material 13b) and has a first surface 131 corresponding to the first surface 121 of the capacitor 12 and a second surface 132 corresponding to the second surface 122 of the capacitor 12.

Figure 17:
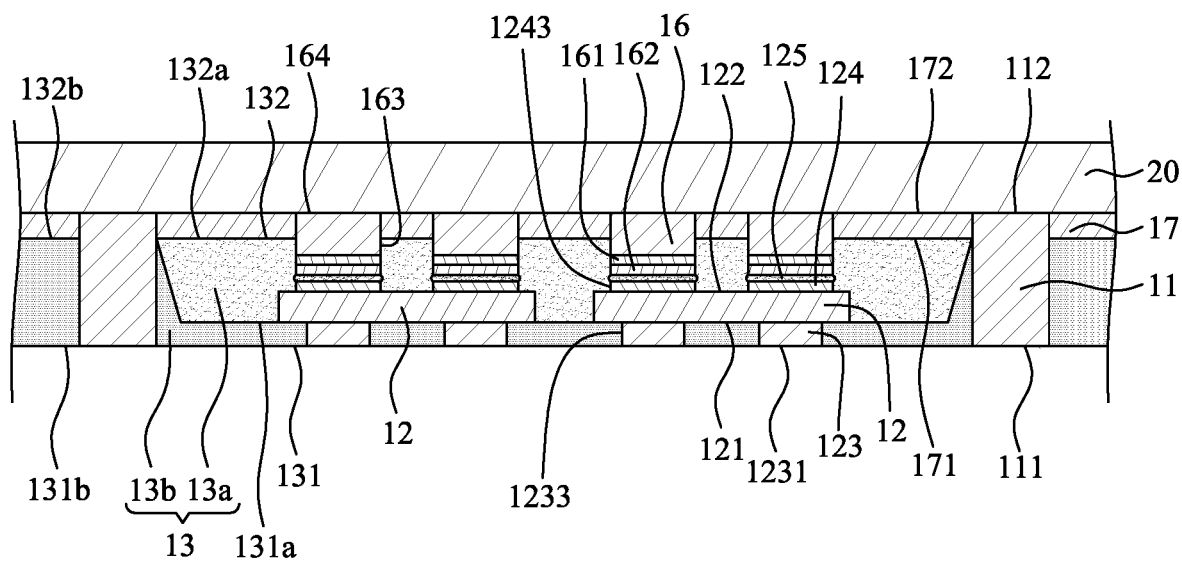
FIG. 17 illustrates one or more stages of an example of a method for manufacturing a capacitor bank structure according to some embodiments of the present disclosure.

Referring to FIG. 17, the second protection material 13b of the protection material 13 is thinned form the first surface 131 to expose the first electrodes 123 and the conductive pillars 11. Meanwhile, the first surfaces 1231 of the first electrodes 123, the first surfaces 111 of the conductive pillars 11 and the first surface 131 of the protection material 13 are substantially coplanar with each other.

Figure 18:
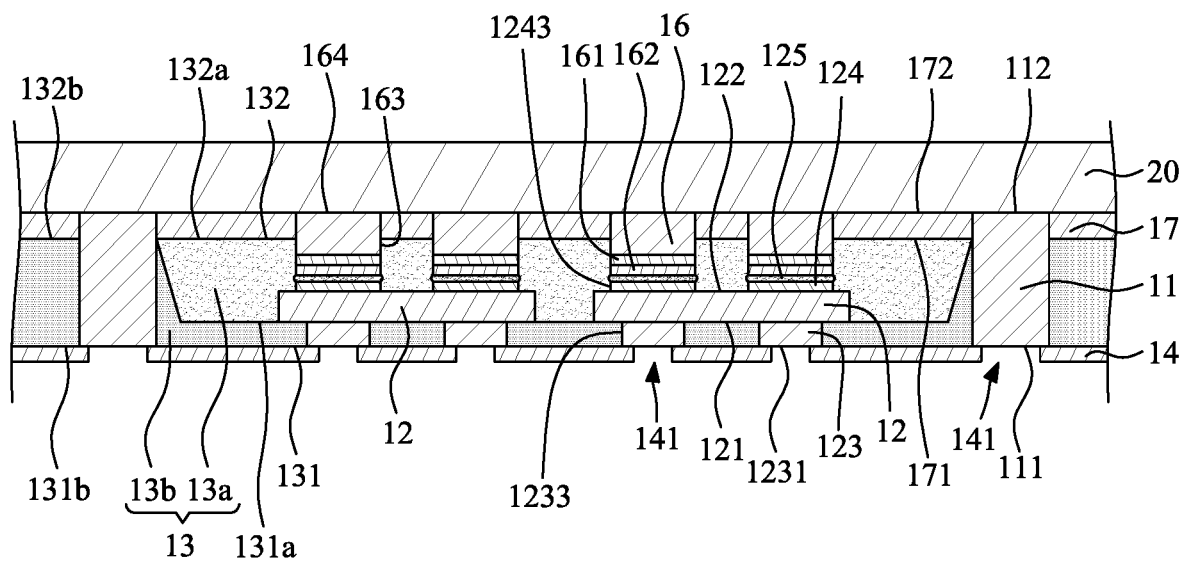
FIG. 18 illustrates one or more stages of an example of a method for manufacturing a capacitor bank structure according to some embodiments of the present disclosure.

Referring to FIG. 18, a first dielectric layer 14 is formed on the first surface 131 of the protection material 13. The first dielectric layer 14 defines a plurality of openings 141 to expose the first electrodes 123 and the conductive pillars 11.

Figure 19:
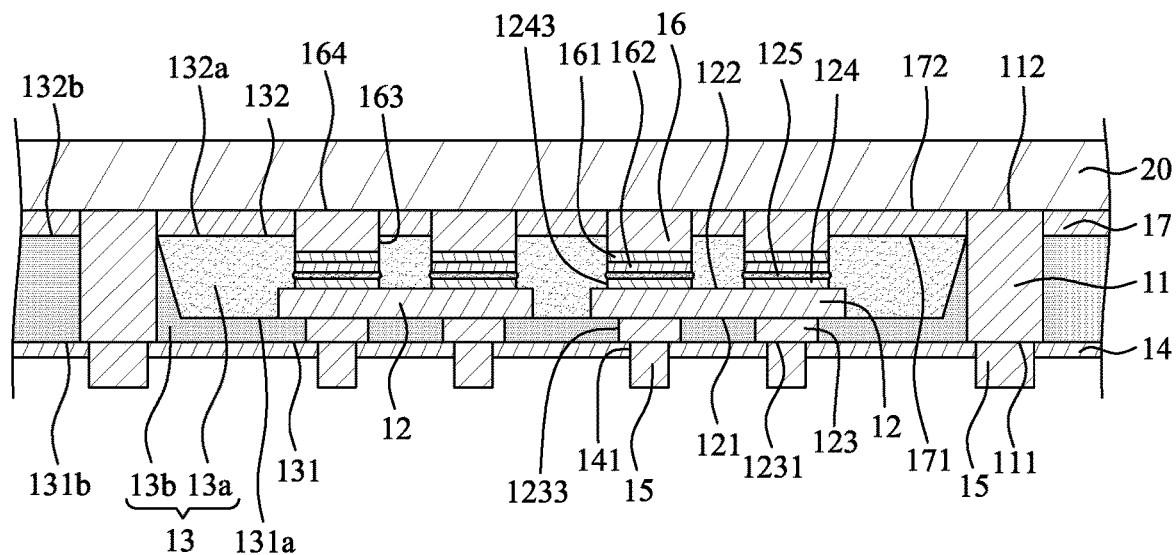
FIG. 19 illustrates one or more stages of an example of a method for manufacturing a capacitor bank structure according to some embodiments of the present disclosure.

Referring to FIG. 19, a plurality of first pillars 15 are formed in the openings 141 of the first dielectric layer 14. The first pillars 15 contact the first electrodes 123 and the conductive pillars 11, and protrude from the first dielectric layer 14.

Figure 20:
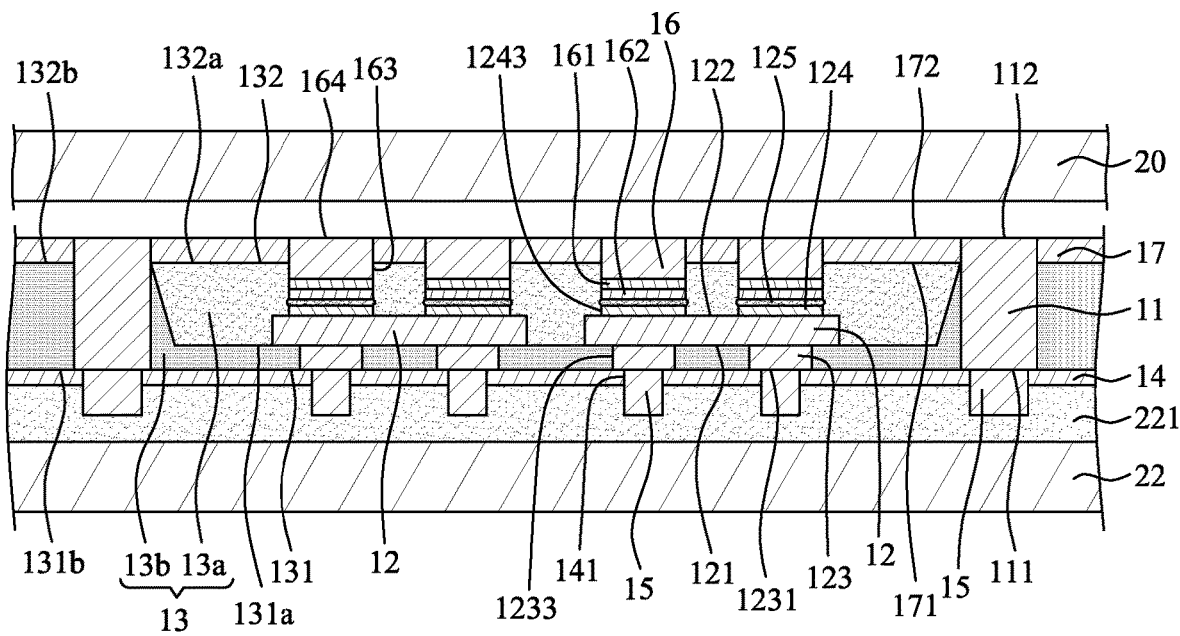
FIG. 20 illustrates one or more stages of an example of a method for manufacturing a capacitor bank structure according to some embodiments of the present disclosure.

Referring to FIG. 20, a second supporting carrier 22 is attached to the first pillars 15 and the first dielectric layer 14 through an adhesive layer 221. Then, the first supporting carrier 20 is removed.

Figure 21:
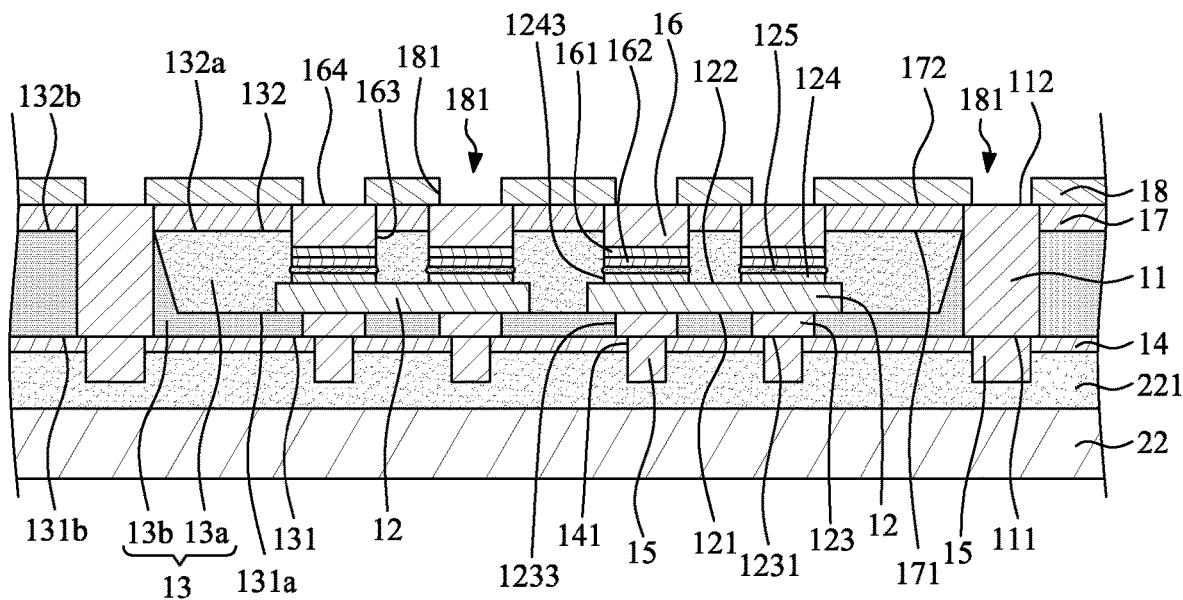
FIG. 21 illustrates one or more stages of an example of a method for manufacturing a s capacitor bank structure according to some embodiments of the present disclosure.

Referring to FIG. 21, a third dielectric layer 18 is formed on the second dielectric layer 17. The third dielectric layer 18 defines a plurality of openings 181 to expose the conductive pads 16 and the conductive pillars 11.

Figure 22:
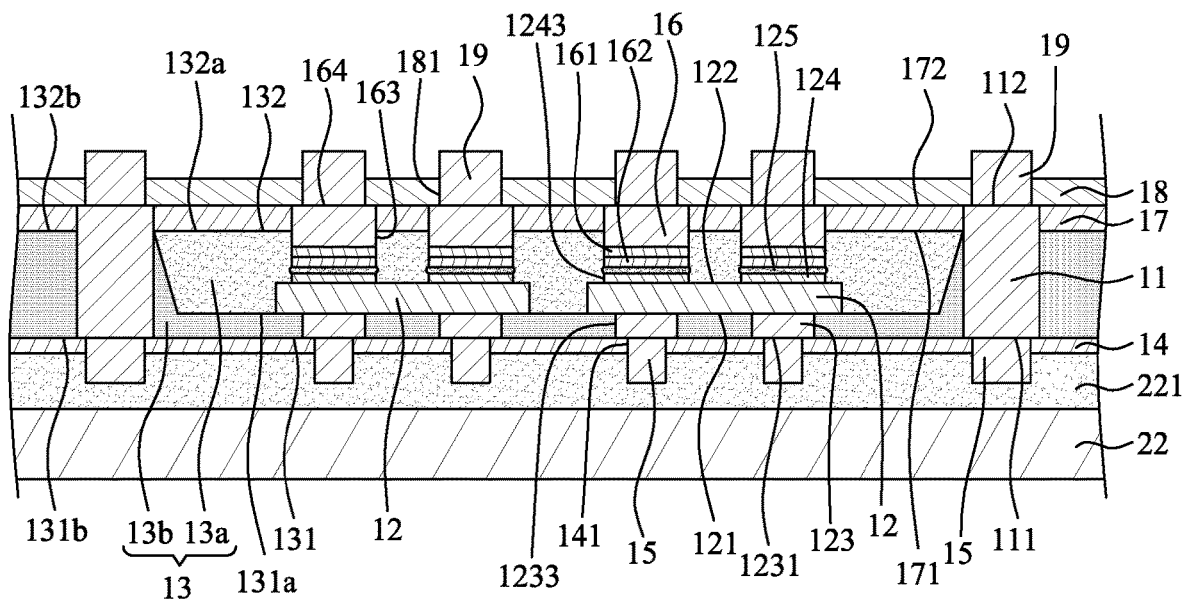
FIG. 22 illustrates one or more stages of an example of a method for manufacturing a capacitor bank structure according to some embodiments of the present disclosure.

Referring to FIG. 22, a plurality of second pillars 19 are formed in the openings 181 of the third dielectric layer 18. The second pillars 19 contact the conductive pads 16 and the conductive pillars 11, and protrude from the third dielectric layer 18. Then, a singulation process is conducted, and the second supporting carrier 22 and the adhesive layer 221 are removed so to form a plurality of capacitor bank structures 1 of FIG. 1.

Figure 23:
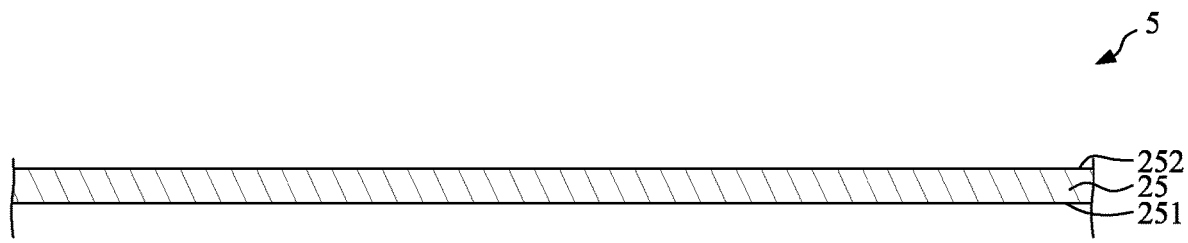
FIG. 23 illustrates one or more stages of an example of a method for manufacturing a semiconductor package structure according to some embodiments of the present disclosure.

FIG. 23 through FIG. 36 illustrate a method for manufacturing a semiconductor package structure according to some embodiments of the present disclosure. In some embodiments, the method is for manufacturing the semiconductor package structure 2 shown in FIG. 4. Referring to FIG. 23, a wafer 5 including a plurality of semiconductor devices 25 is provided. The semiconductor device 25 may be a logic die such as a CPU (Central Processing Unit), a GPU (Graphics Processing Unit) or an AP (Application Processor), and may have a first surface 251 and a second surface 252 opposite to the first surface 251.

Figure 24:
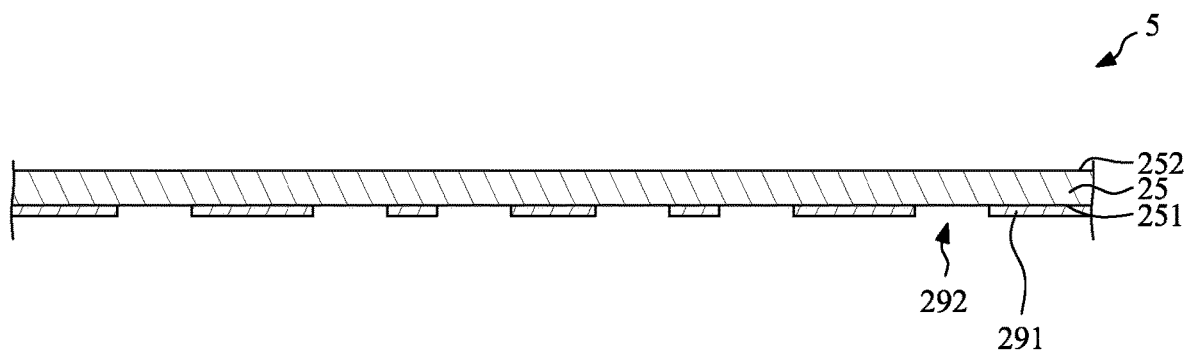
FIG. 24 illustrates one or more stages of an example of a method for manufacturing a semiconductor package structure according to some embodiments of the present disclosure.

Referring to FIG. 24, a first passivation layer 291 is formed on the first surface 251 of the semiconductor device 25 (e.g., a first surface of the wafer 5). The first passivation layer 291 defines a plurality of openings 292.

Figure 25:
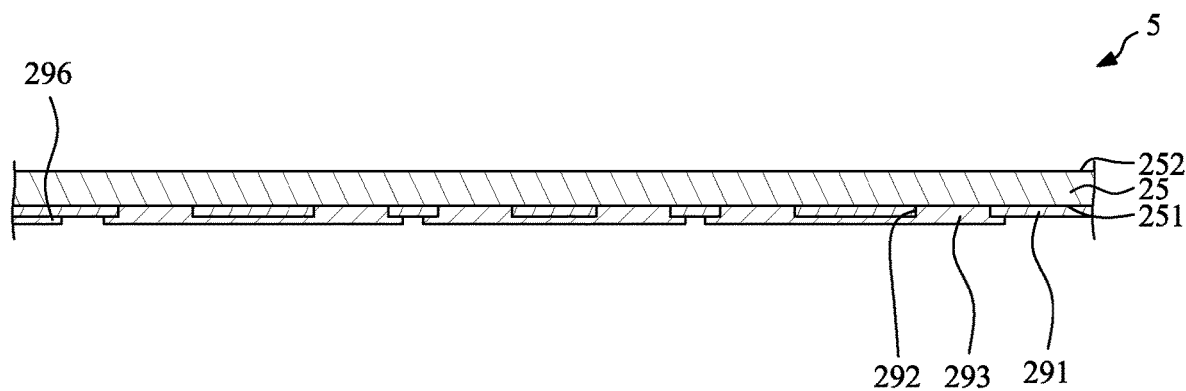
FIG. 25 illustrates one or more stages of an example of a method for manufacturing a semiconductor package structure according to some embodiments of the present disclosure.

Referring to FIG. 25, a redistribution layer (RDL) 293 is formed in the openings 292 and on the first passivation layer 291. In some embodiments, the redistribution layer (RDL) 293 may include a fiducial mark 296.

Figure 26:
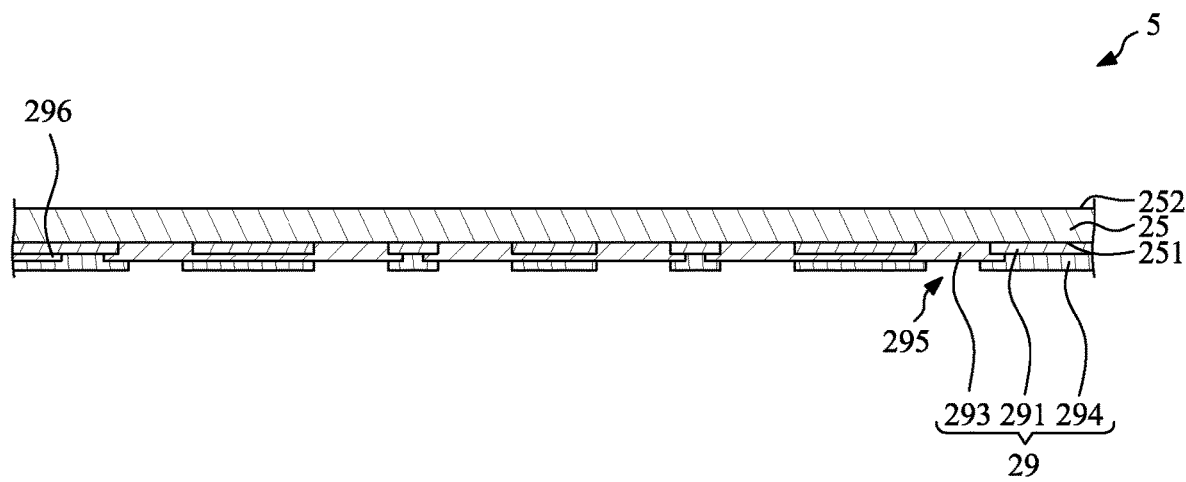
FIG. 26 illustrates one or more stages of an example of a method for manufacturing a semiconductor package structure according to some embodiments of the present disclosure.

Referring to FIG. 26, a second passivation layer 294 is formed on the redistribution layer (RDL) 293 and the first passivation layer 291. The second passivation layer 294 defines a plurality of openings 295 to expose portions of the redistribution layer (RDL) 293. Meanwhile, a redistribution structure 29 (including the first passivation layer 291, the redistribution layer (RDL) 293 and the second passivation layer 294) is formed.

Figure 27:
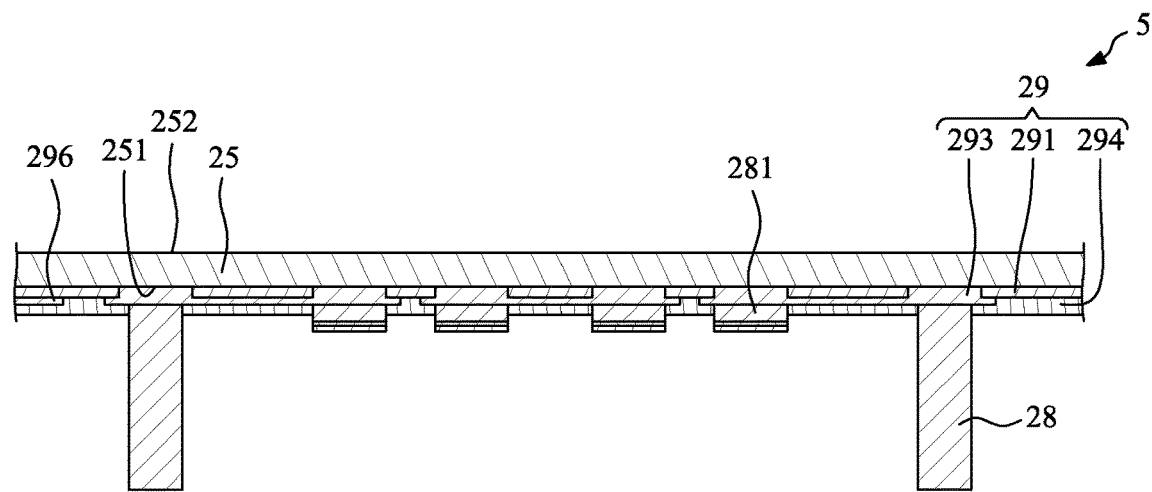
FIG. 27 illustrates one or more stages of an example of a method for manufacturing a semiconductor package structure according to some embodiments of the present disclosure.

Referring to FIG. 27, a plurality of conductive pads 281 and a plurality of inner pillars 28 are formed in the openings 295 and on the redistribution layer (RDL) 293. There may be at least one surface finish layer on the end surface of the conductive pad 281.

Figure 28:
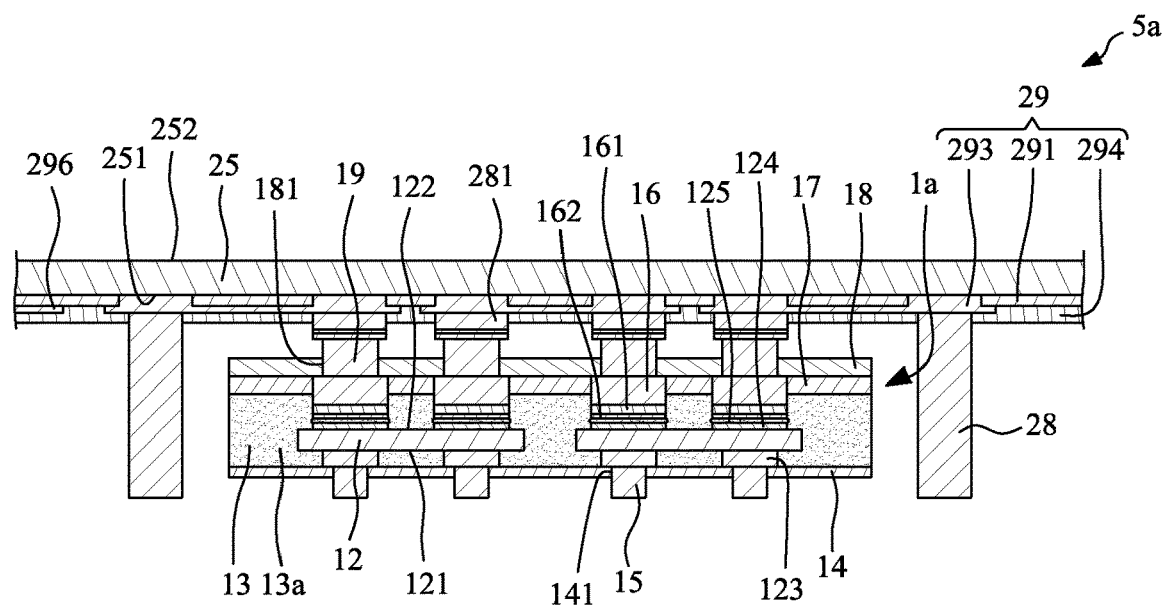
FIG. 28 illustrates one or more stages of an example of a method for manufacturing a semiconductor package structure according to some embodiments of the present disclosure.

Referring to FIG. 28, the capacitor bank structure 1a of FIG. 2 is attached to the conductive pads 281. In one embodiment, the second pillars 19 of the capacitor bank structure 1a are connected to the surface finish layers of conductive pads 281. Thus, the capacitors 12 are electrically connected to the semiconductor device 25. The inner pillars 28 are disposed around the capacitor bank structure 1a (including the capacitors 12). It is noted that the fiducial mark 296 of the redistribution layer (RDL) 293 can be used for positioning when the capacitor bank structure 1a is attached to the redistribution structure 29

Figure 29:
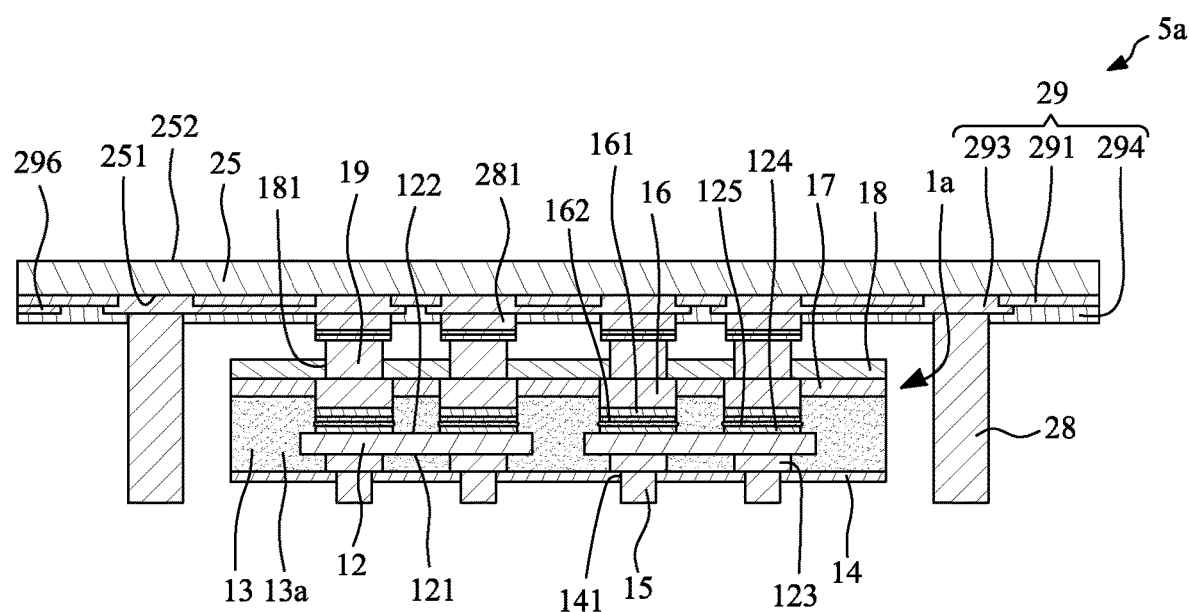
FIG. 29 illustrates one or more stages of an example of a method for manufacturing a semiconductor package structure according to some embodiments of the present disclosure.

Referring to FIG. 29, a singulation process is conducted to the wafer 5 form a plurality of assemblies 5a.

Figure 30:
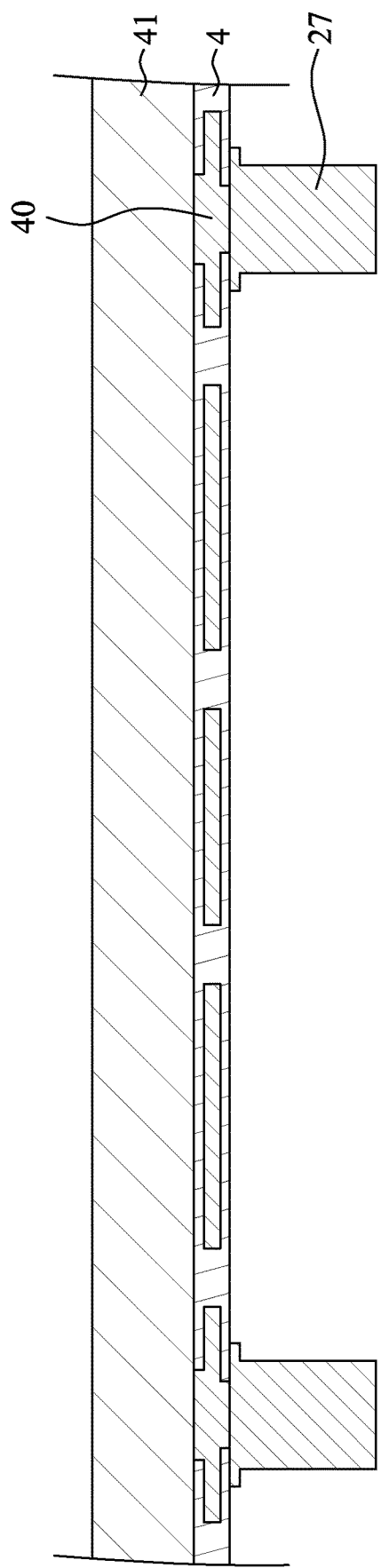
FIG. 30 illustrates one or more stages of an example of a method for manufacturing a semiconductor package structure according to some embodiments of the present disclosure.

Referring to FIG. 30, a third supporting carrier 41 (or a first carrier) is provided. Then, a wiring structure 4 (including at least one dielectric layer and at least one circuit layer 40) is formed on the third supporting carrier 41 (or the first carrier). Then, a plurality of outer pillars 27 are formed or attached on the wiring structure 4.

Figure 31:
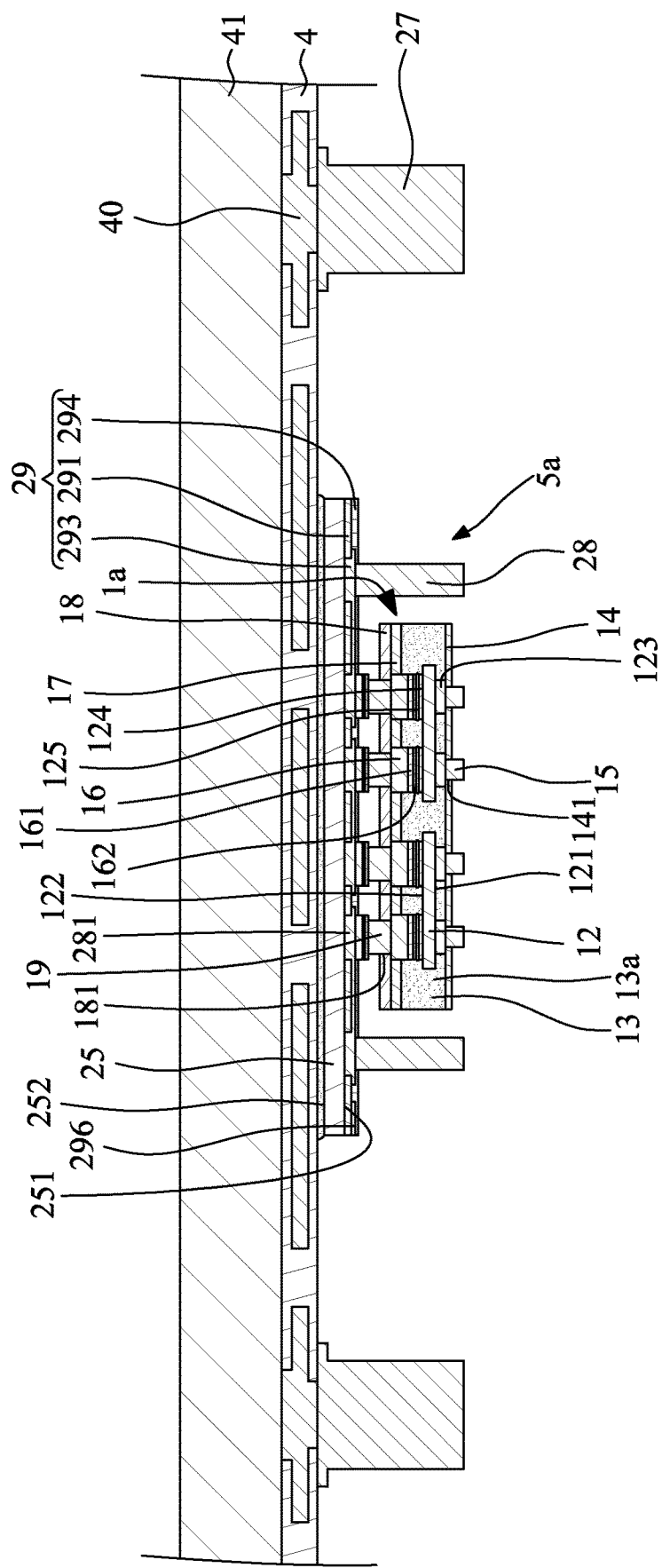
FIG. 31 illustrates one or more stages of an example of a method for manufacturing a semiconductor package structure according to some embodiments of the present disclosure.

Referring to FIG. 31, the second surface 252 of the semiconductor device 25 of the assembly 5a is attached (or adhered) to the wiring structure 4 on the third supporting carrier 41 (or the first carrier). Meanwhile, the outer pillars 27 are disposed around the assembly 5a.

Figure 32:
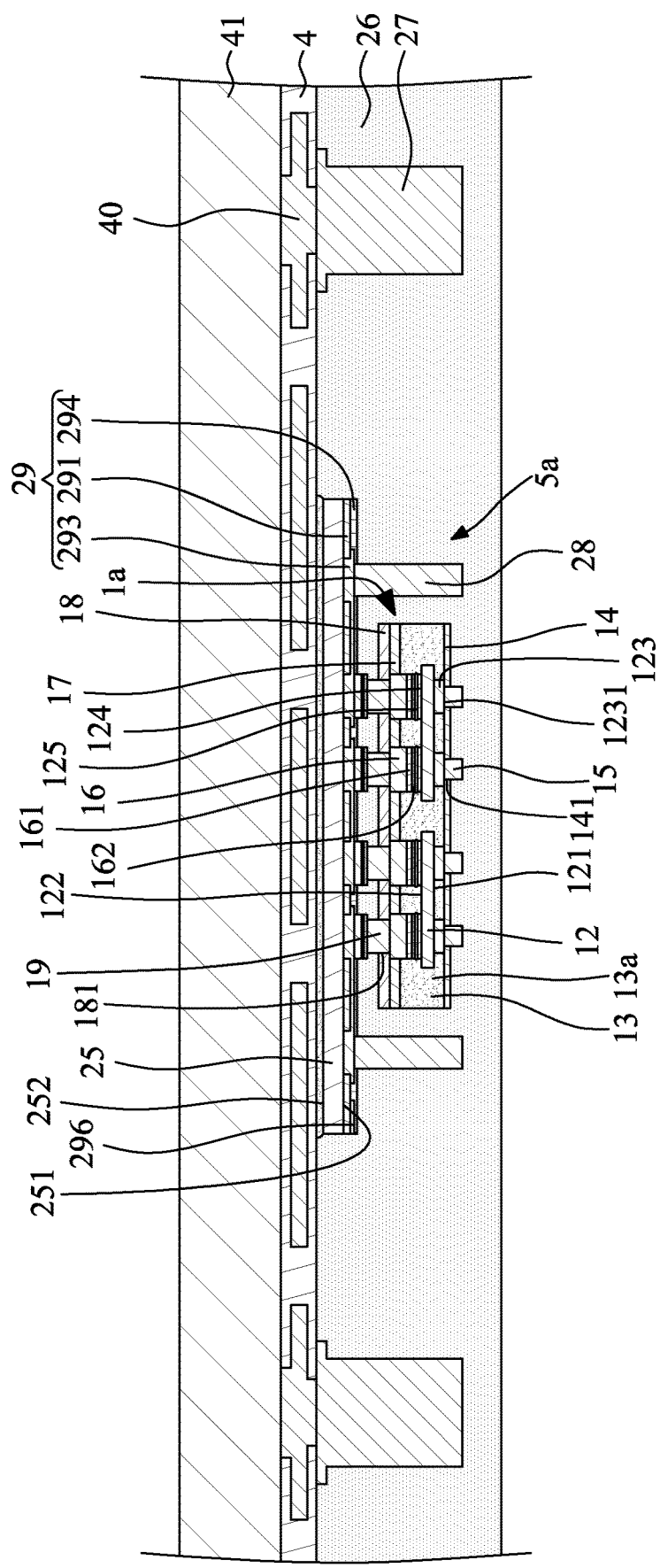
FIG. 32 illustrates one or more stages of an example of a method for manufacturing a semiconductor package structure according to some embodiments of the present disclosure.

Referring to FIG. 32, an encapsulant 26 is formed to cover the assembly 5a (including the semiconductor device 25, the capacitors 12) and the outer pillars 27.

Figure 33:
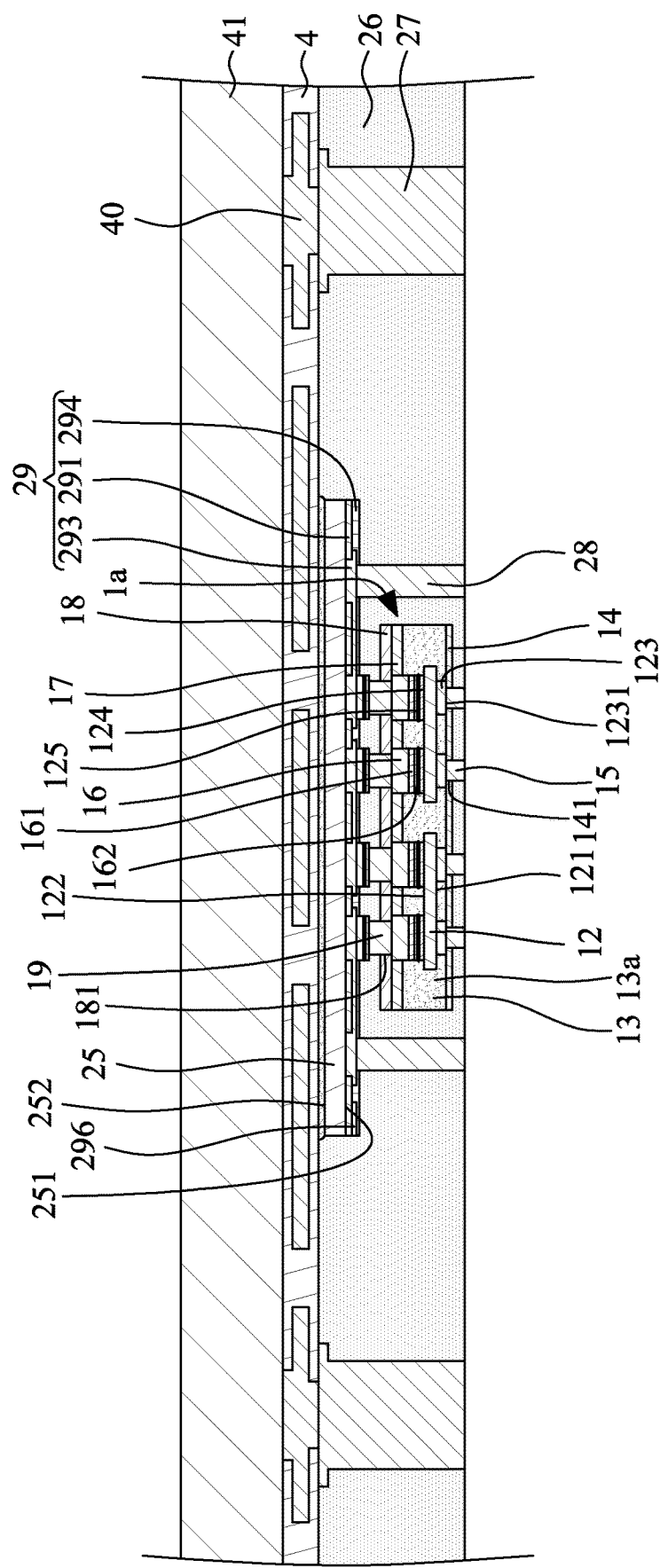
FIG. 33 illustrates one or more stages of an example of a method for manufacturing a semiconductor package structure according to some embodiments of the present disclosure.

Referring to FIG. 33, the encapsulant 26 is thinned from its bottom surface by, for example, grinding. Meanwhile, the bottom surface of the encapsulant 26, the bottom surfaces of the outer pillars 27, the bottom surfaces of the inner pillars 28 and the bottom surfaces of the first pillars 15 are substantially coplanar with each other.

Figure 34:
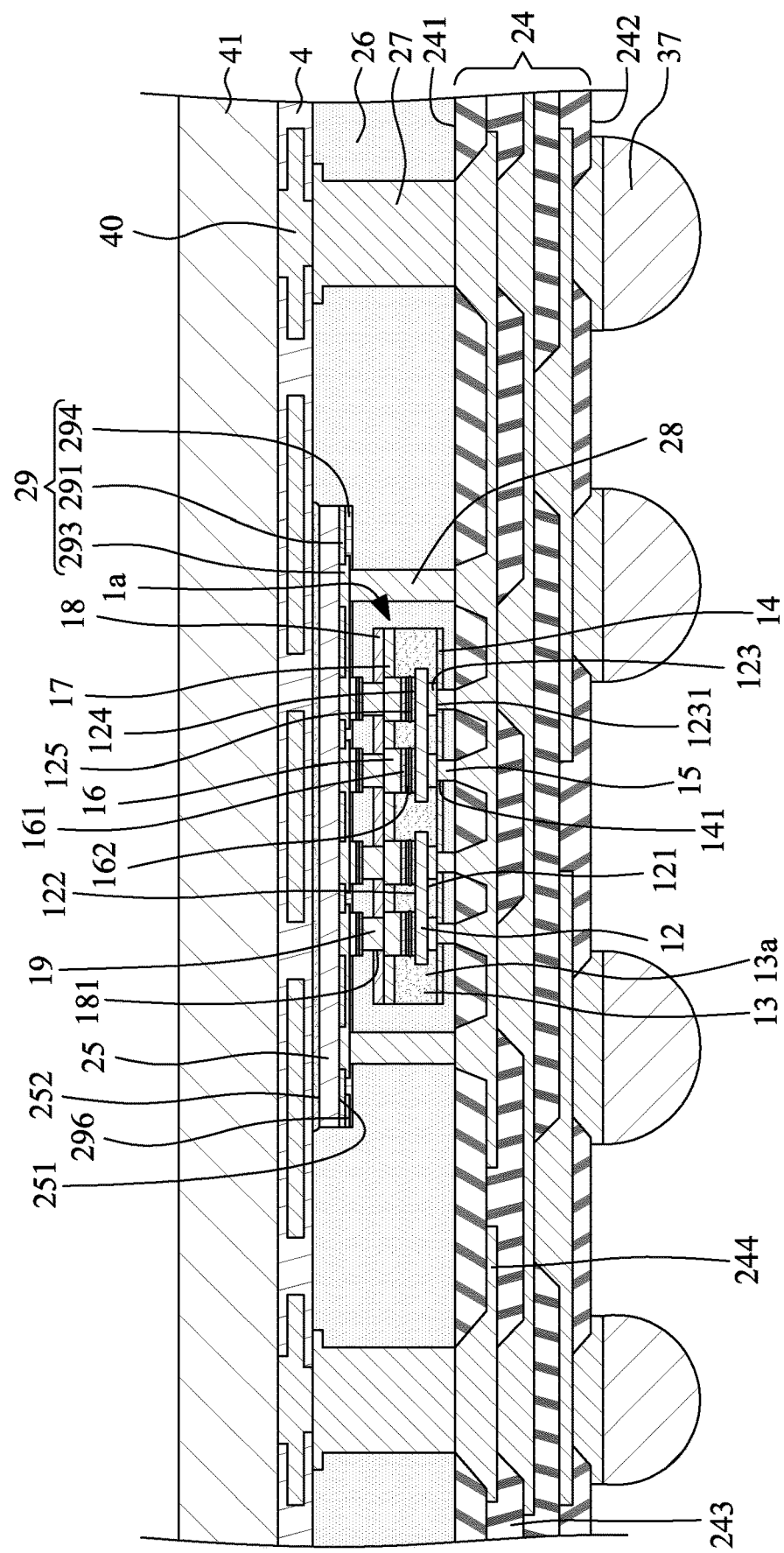
FIG. 34 illustrates one or more stages of an example of a method for manufacturing a semiconductor package structure according to some embodiments of the present disclosure.

Referring to FIG. 34, a conductive structure 24 is formed or disposed on the encapsulant 26 to electrically connect the outer pillars 27, the first pillars 15 and the inner pillars 28. The conductive structure 24 has a top surface 241 and a bottom surface 242 opposite to the top surface 241. In some embodiments, the conductive structure 24 may include four dielectric layers 243 (e.g., four passivation layers) and four metal circuit layers 244 electrically connected to one another. The first surface 251 of the semiconductor device 25 is electrically connected to the top surface 241 of the conductive structure 24 through the redistribution circuit structure 29, the capacitor bank structure 1a, and the inner pillars 28. The capacitors 12 are not embedded in the conductive structure 24. Then, a plurality of solder bumps 37 are formed on the second surface 242 of the conductive structure 24.

Figure 35:
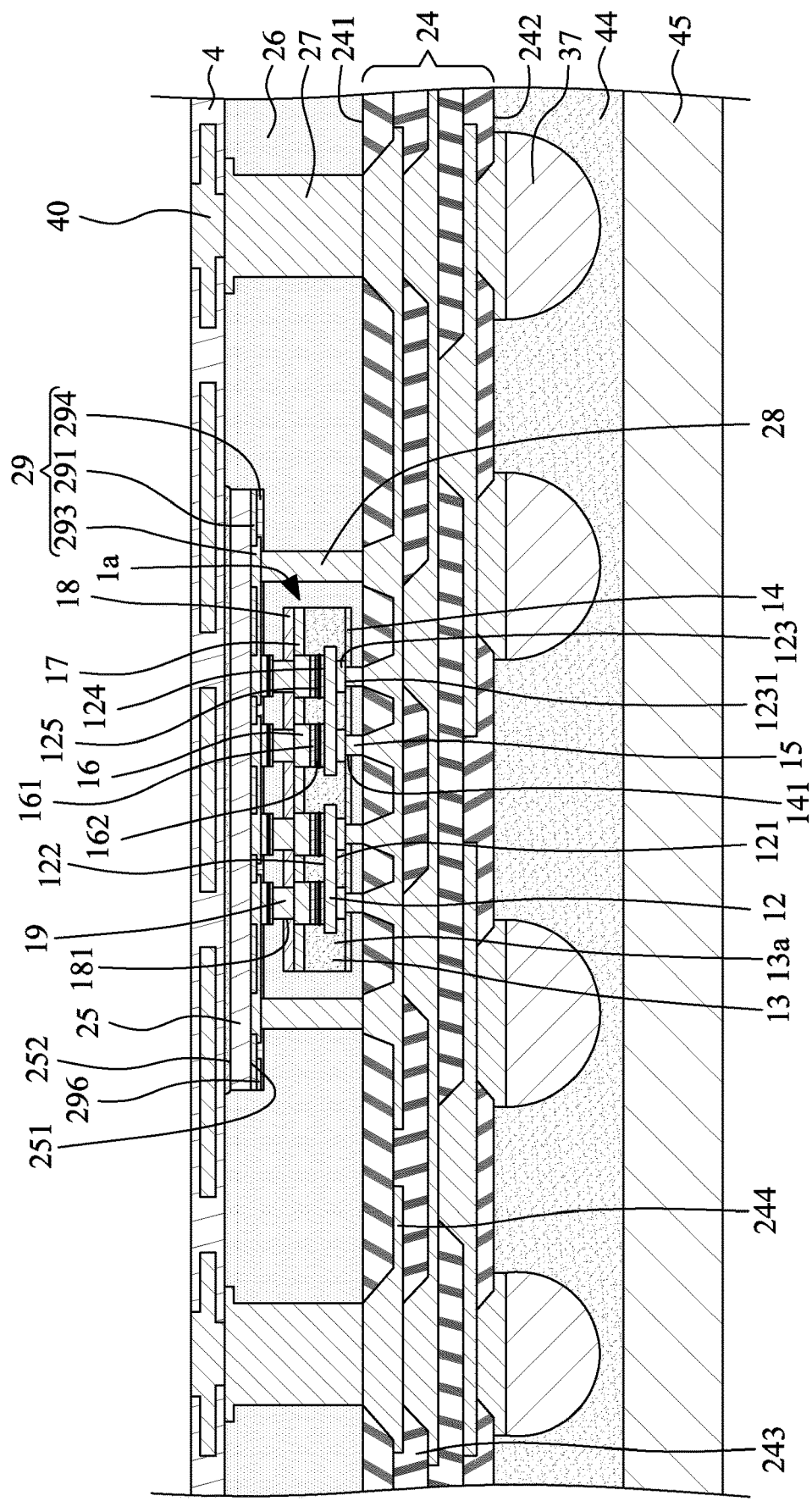
FIG. 35 illustrates one or more stages of an example of a method for manufacturing a semiconductor package structure according to some embodiments of the present disclosure.

Referring to FIG. 35, a fourth supporting carrier 45 (or a second carrier) is attached to the second surface 242 of the conductive structure 24 through an adhesive layer 44. Then, the third supporting carrier 41 (or the first carrier) is removed.

Figure 36:
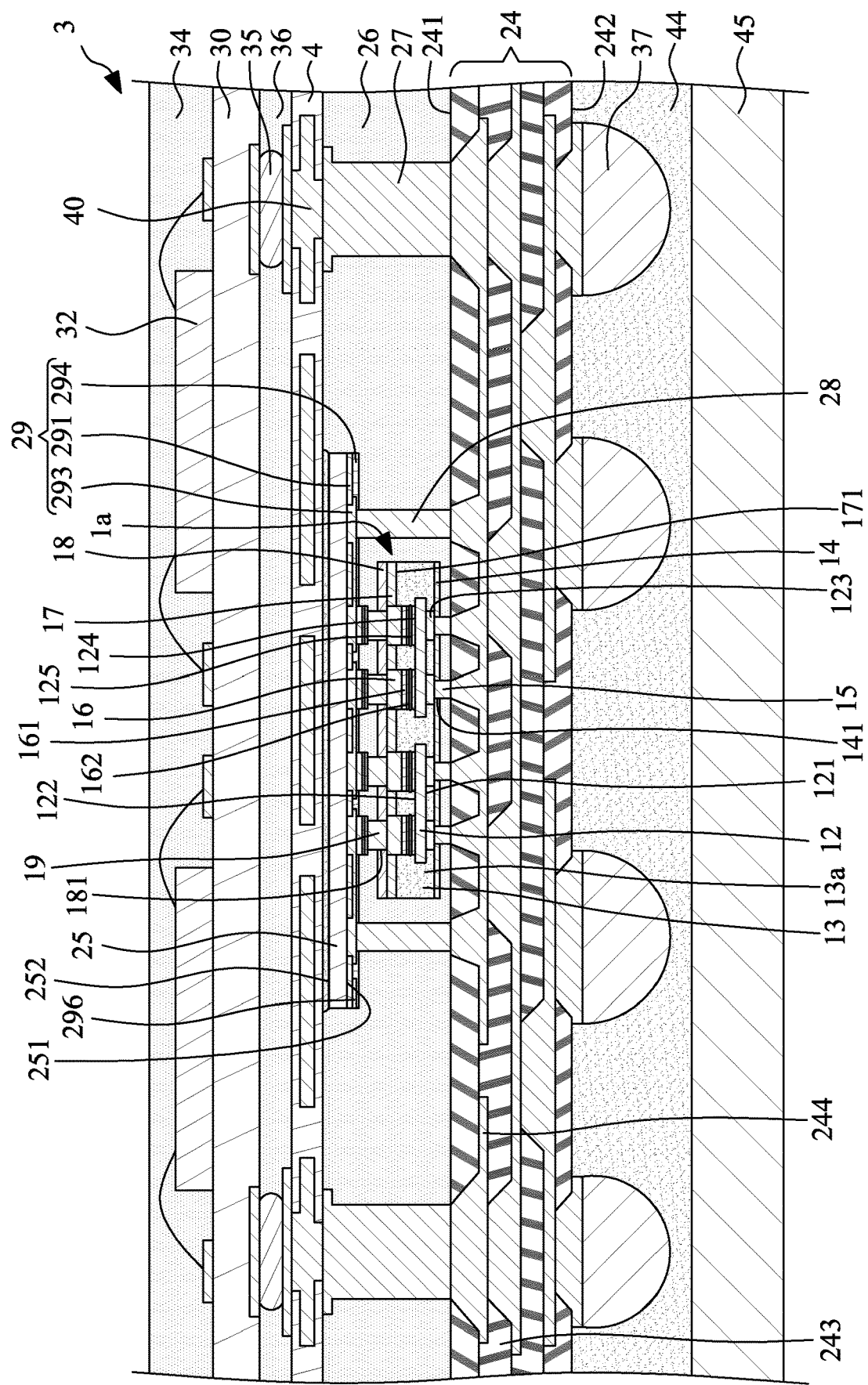
FIG. 36 illustrates one or more stages of an example of a method for manufacturing a semiconductor package structure according to some embodiments of the present disclosure.

Referring to FIG. 36, a top package 3 is electrically connected to the outer pillars 27. In one embodiment, the top package 3 is electrically connected to the outer pillars 27 and the semiconductor device 25 through the inner solders 35 and the wiring structure 4. In one embodiment, the top package 3 includes a top substrate 30, one or more memory dice 32 and a top encapsulant 34. The memory die 32 may be a synchronous random access memory (SRAM), a dynamic random access memory (DRAM), a low power DDR (LPDDR) or a high bandwidth memory (HBM). The memory dice 32 are electrically connected to the top substrate 30 by wire bonding. However, the memory dice 32 may be electrically connected to the top substrate 30 by flip-chip bonding. The top encapsulant 34 covers the more memory dice 32 and the top substrate 30. In addition, a middle encapsulant 36 may be formed or disposed in the space between the top substrate 30 and the wiring structure 4 to cover and protect the inner solders 35. Then, a singulation process is conducted, and the fourth supporting carrier 45 (or the second carrier) and the adhesive layer 44 are removed so to form a plurality of semiconductor package structures 2 of FIG. 4.

Figure 37:
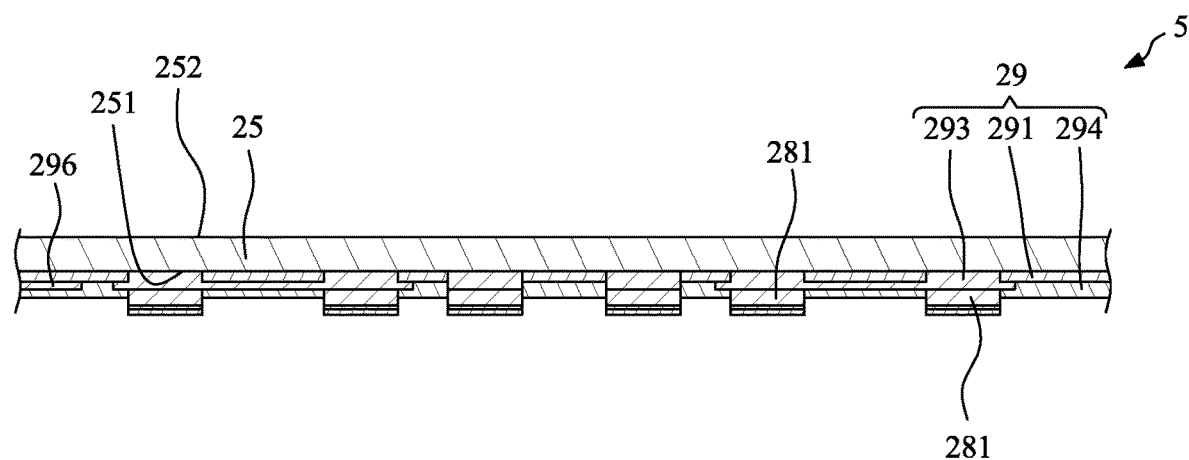
FIG. 37 illustrates one or more stages of an example of a method for manufacturing a semiconductor package structure according to some embodiments of the present disclosure.

FIG. 37 through FIG. 46 illustrate a method for manufacturing a semiconductor package structure according to some embodiments of the present disclosure. In some embodiments, the method is for manufacturing the semiconductor package structure 2a shown in FIG. 5. The initial stages of the illustrated process are the same as, or similar to, the stages illustrated in FIG. 23 to FIG. 26. FIG. 37 depicts a stage subsequent to that depicted in FIG. 26.

Referring to FIG. 37, a plurality of conductive pads 281 are formed in the openings 295 and on the redistribution layer (RDL) 293. There may be a surface finish layer on the end surface of the conductive pad 281.

Figure 38:
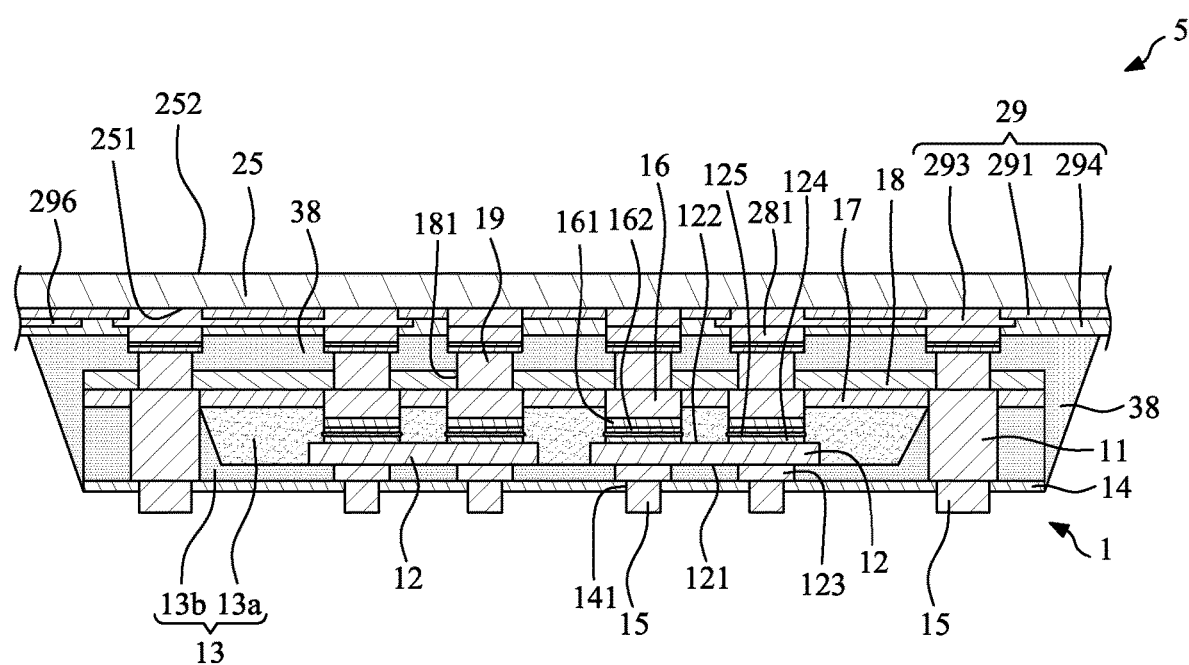
FIG. 38 illustrates one or more stages of an example of a method for manufacturing a semiconductor package structure according to some embodiments of the present disclosure.

Referring to FIG. 38, the capacitor bank structure 1 of FIG. 1 is attached to the conductive pads 281. In one embodiment, the second pillars 19 and the conductive pillars 11 of the capacitor bank structure 1 are connected to the surface finish layers of conductive pads 281. Thus, the capacitors 12 are electrically connected to the semiconductor device 25. Then, an underfill 38 is formed between the space between the capacitor bank structure 1 and the redistribution circuit structure 29 (or the semiconductor device 25) to cover and protect the joint structure between the capacitor bank structure 1 and the redistribution circuit structure 29 (or the semiconductor device 25).

Figure 39:
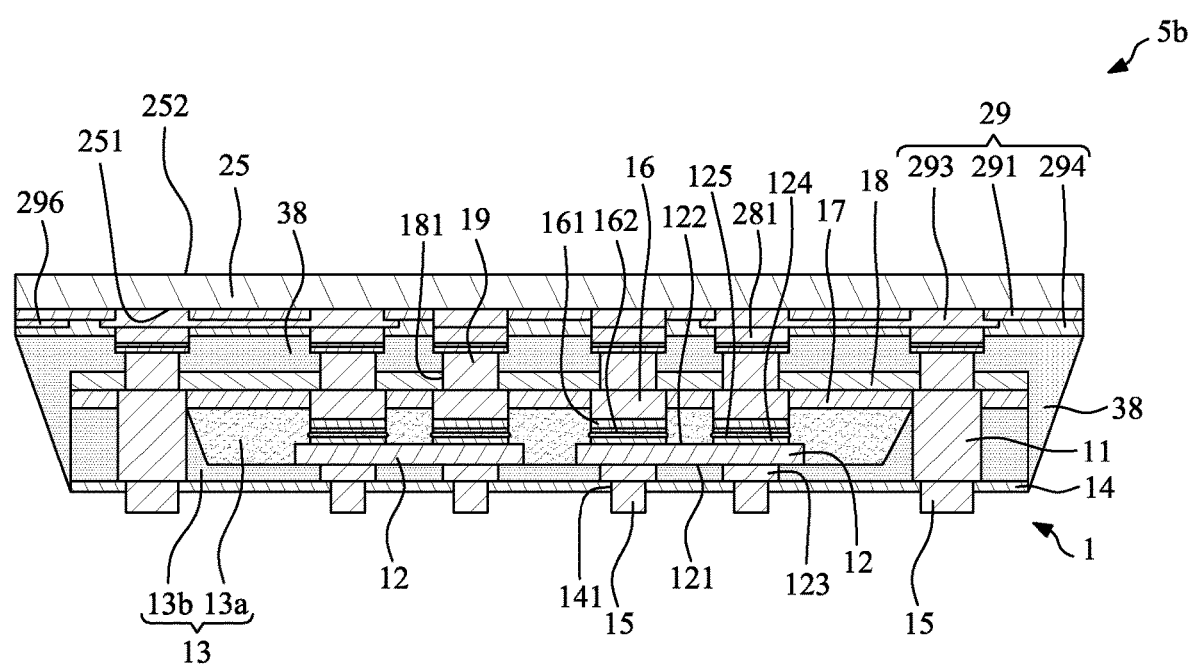
FIG. 39 illustrates one or more stages of an example of a method for manufacturing a semiconductor package structure according to some embodiments of the present disclosure.

Referring to FIG. 39, a singulation process is conducted to the wafer 5 form a plurality of assemblies 5b.

Figure 40:
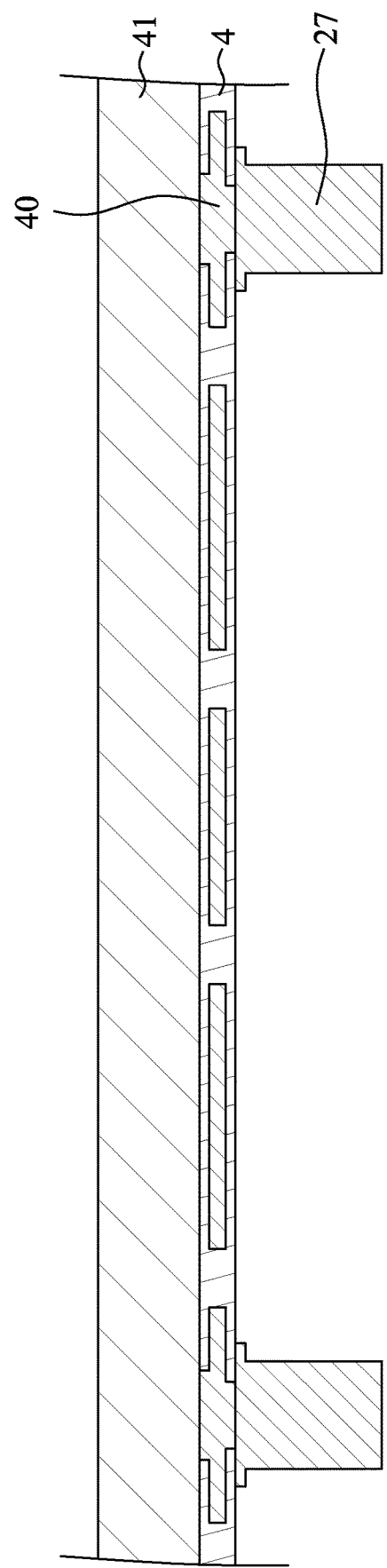
FIG. 40 illustrates one or more stages of an example of a method for manufacturing a semiconductor package structure according to some embodiments of the present disclosure.

Referring to FIG. 40, a third supporting carrier 41 (or a first carrier) is provided. Then, a wiring structure 4 (including at least one dielectric layer and at least one circuit layer 40) is formed on the third supporting carrier 41 (or the first carrier). Then, a plurality of outer pillars 27 are formed or attached on the wiring structure 4.

Figure 41:
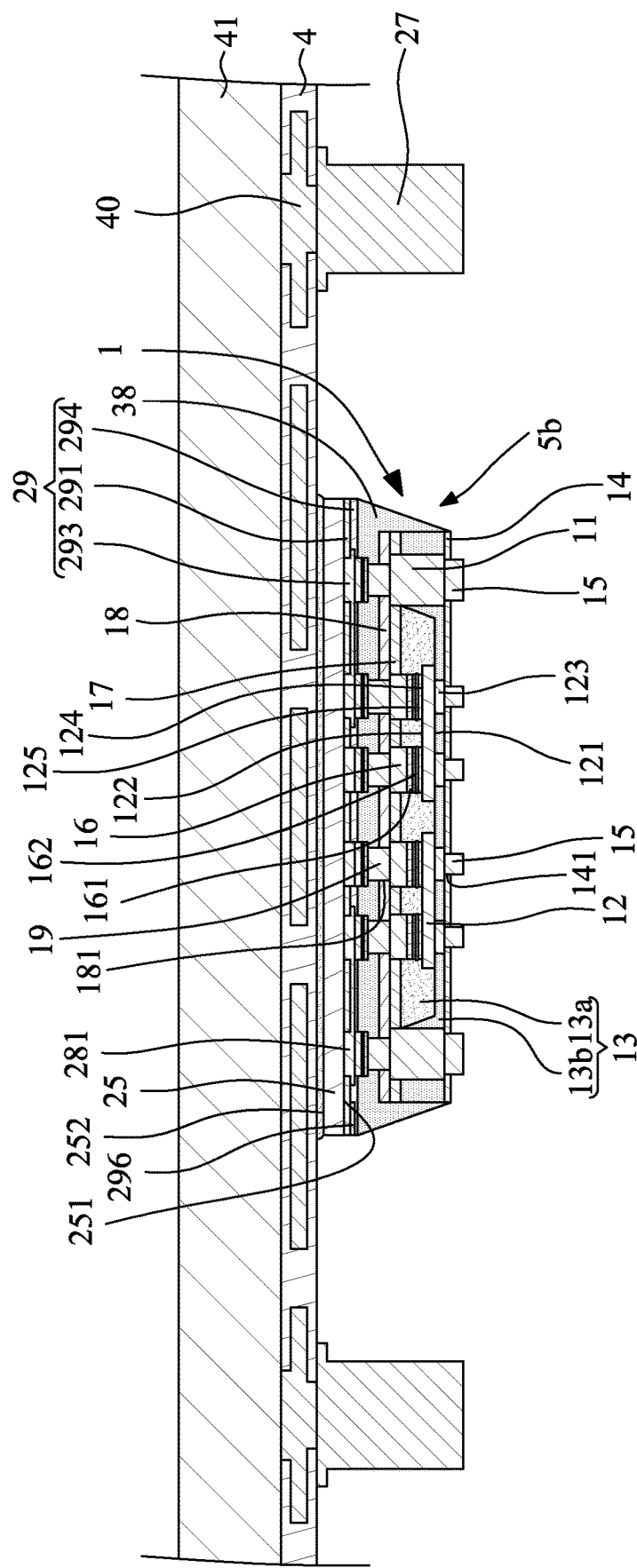
FIG. 41 illustrates one or more stages of an example of a method for manufacturing a semiconductor package structure according to some embodiments of the present disclosure.

Referring to FIG. 41, the second surface 252 of the semiconductor device 25 of the assembly 5b is attached (or adhered) to the wiring structure 4 on the third supporting carrier 41 (or the first carrier). Meanwhile, the outer pillars 27 are disposed around the assembly 5b.

Figure 42:
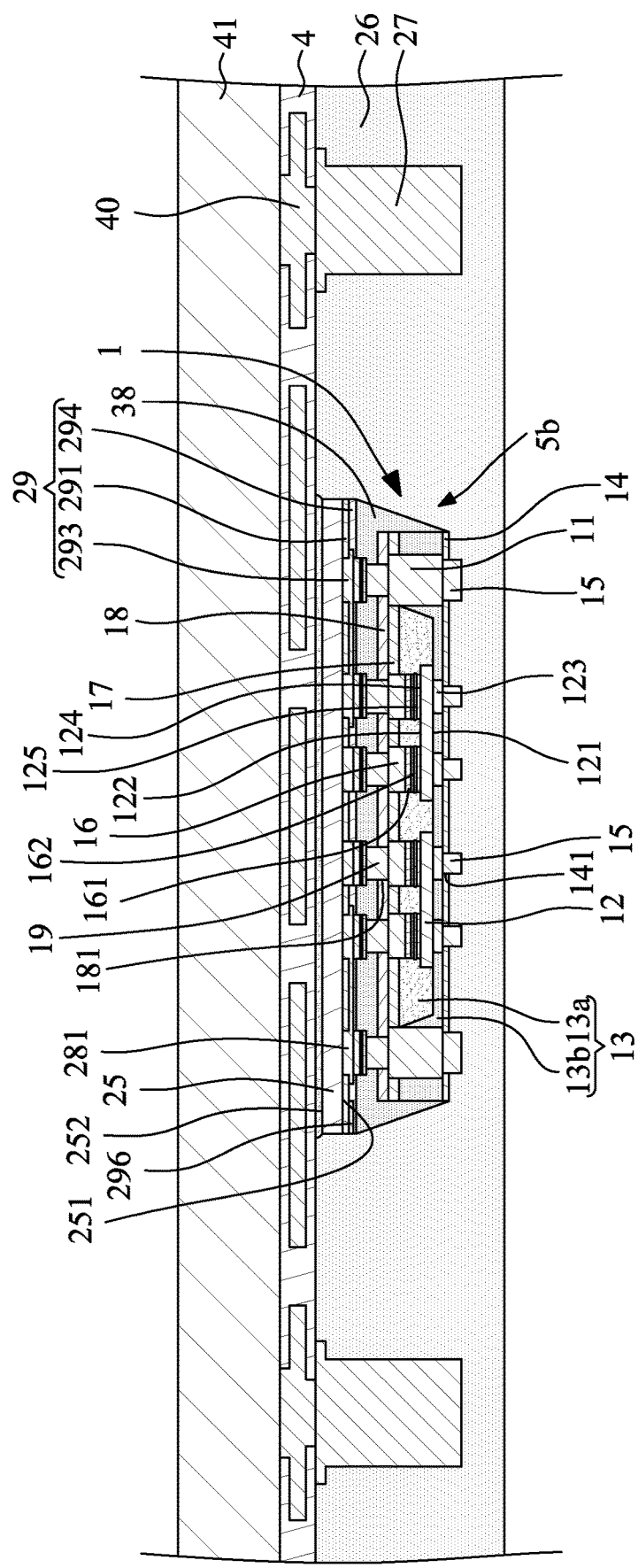
FIG. 42 illustrates one or more stages of an example of a method for manufacturing a semiconductor package structure according to some embodiments of the present disclosure.

Referring to FIG. 42, an encapsulant 26 is formed to cover the assembly 5b (including the semiconductor device 25, the capacitors 12) and the outer pillars 27.

Figure 43:
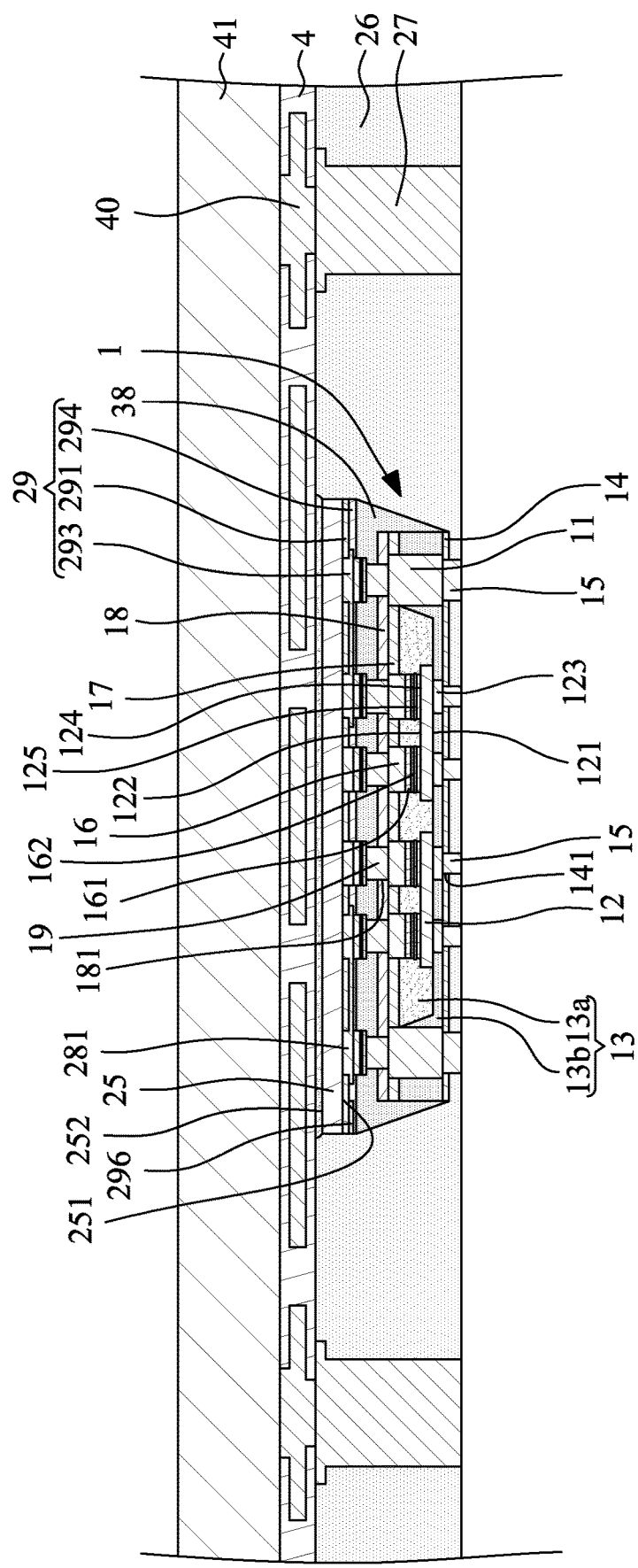
FIG. 43 illustrates one or more stages of an example of a method for manufacturing a semiconductor package structure according to some embodiments of the present disclosure.

Referring to FIG. 43, the encapsulant 26 is thinned from its bottom surface by, for example, grinding. Meanwhile, the bottom surface of the encapsulant 26, the bottom surfaces of the outer pillars 27 and the bottom surfaces of the first pillars 15 are substantially coplanar with each other.

Figure 44:
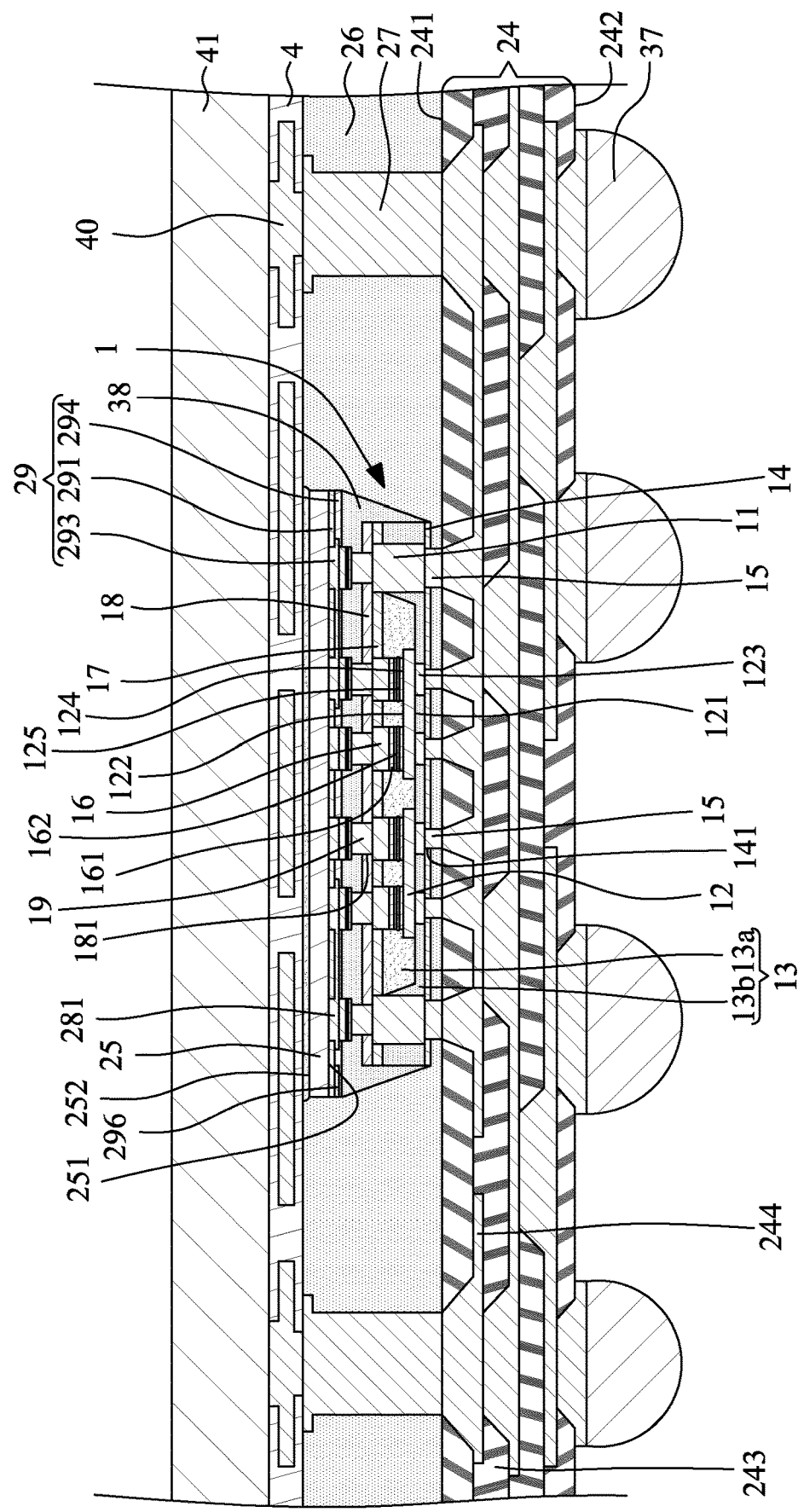
FIG. 44 illustrates one or more stages of an example of a method for manufacturing a semiconductor package structure according to some embodiments of the present disclosure.

Referring to FIG. 44, a conductive structure 24 is formed or disposed on the encapsulant 26 to electrically connect the outer pillars 27 and the first pillars 15. The conductive structure 24 has a top surface 241 and a bottom surface 242 opposite to the top surface 241. The first surface 251 of the semiconductor device 25 is electrically connected to the top surface 241 of the conductive structure 24 through the redistribution circuit structure 29 and the capacitor bank structure 1. Then, a plurality of solder bumps 37 are formed on the second surface 242 of the conductive structure 24.

Figure 45:
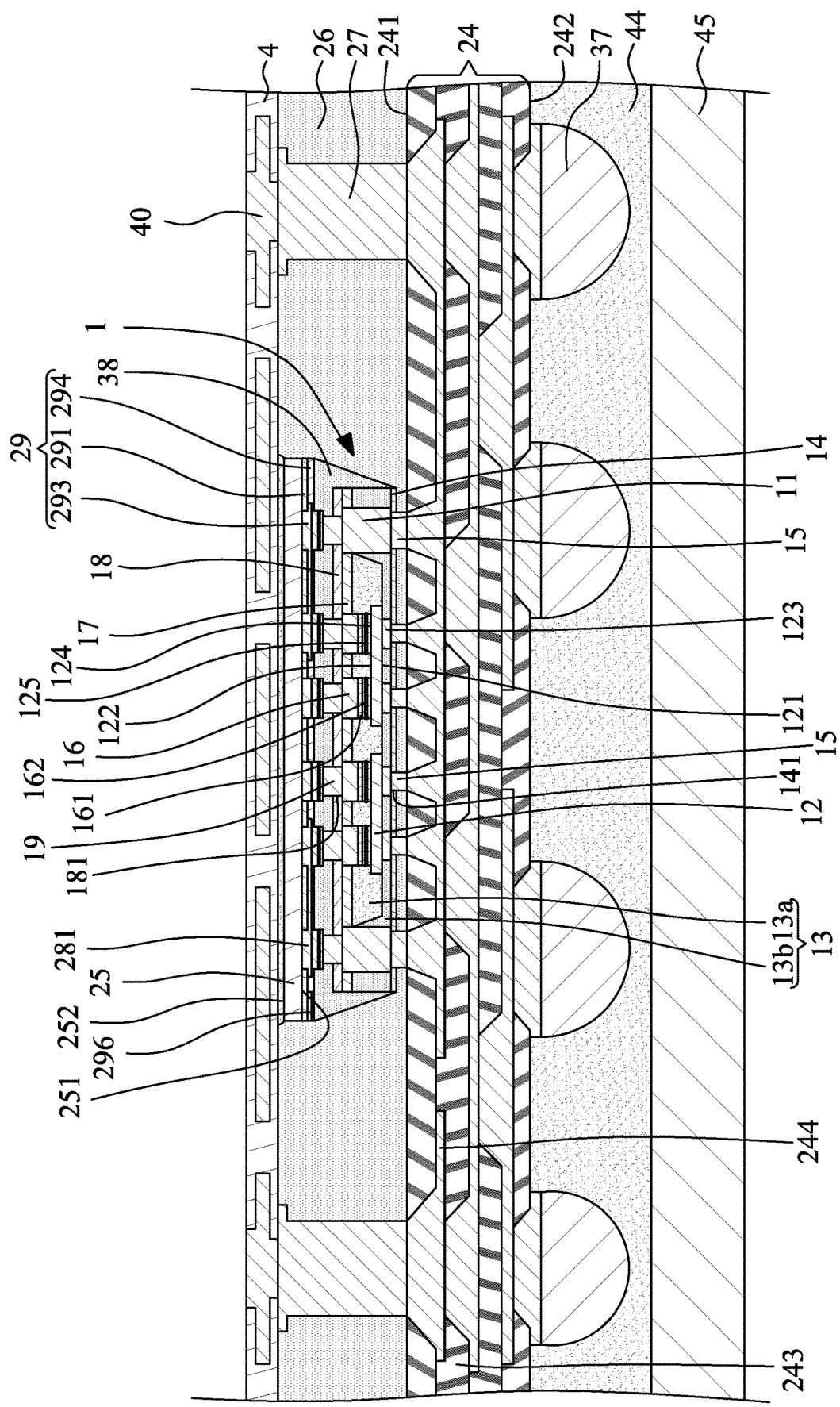
FIG. 45 illustrates one or more stages of an example of a method for manufacturing a semiconductor package structure according to some embodiments of the present disclosure.

Referring to FIG. 45, a fourth supporting carrier 45 (or a second carrier) is attached to the second surface 242 of the conductive structure 24 through an adhesive layer 44. Then, the third supporting carrier 41 (or the first carrier) is removed.

Figure 46:
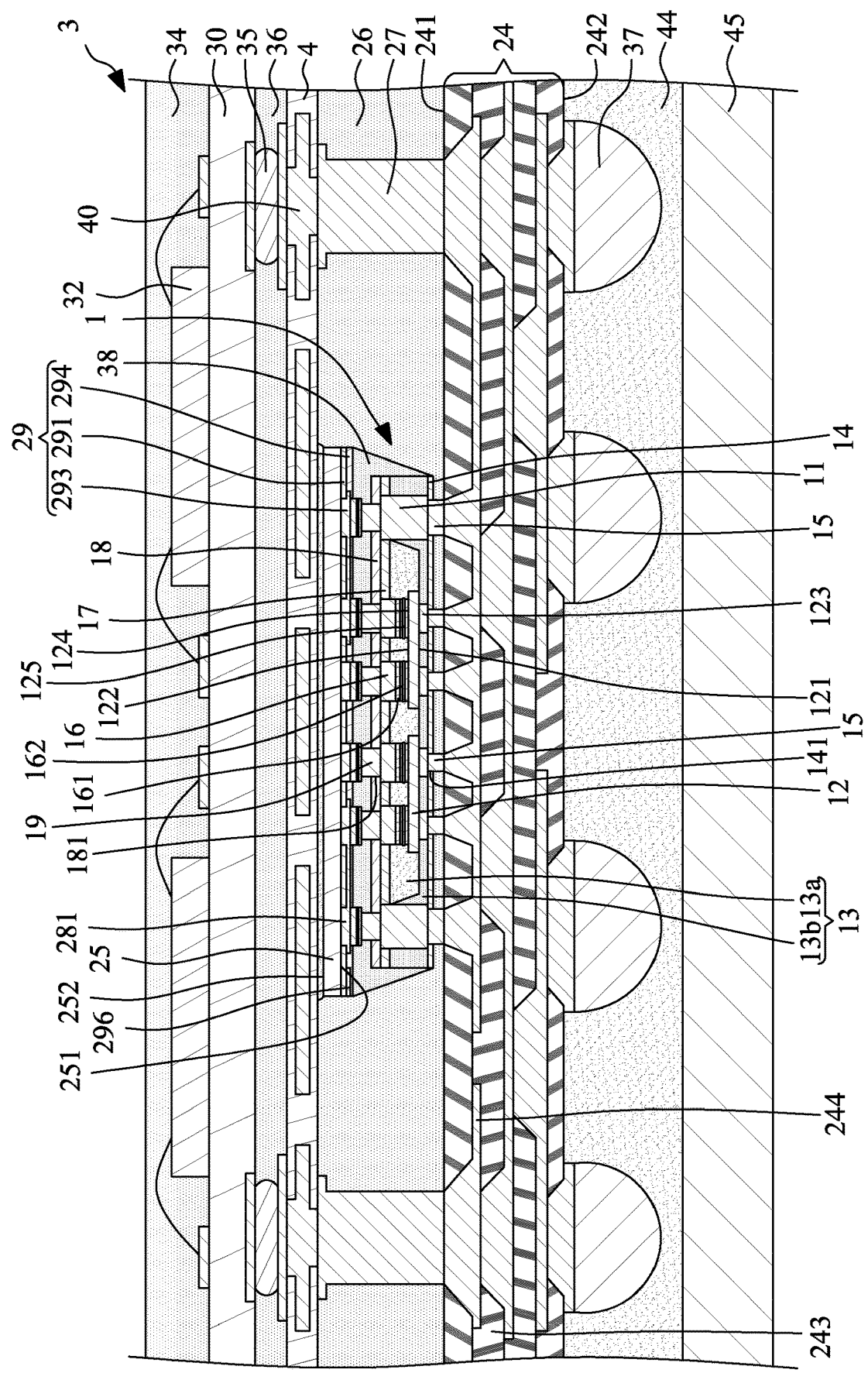
FIG. 46 illustrates one or more stages of an example of a method for manufacturing a semiconductor package structure according to some embodiments of the present disclosure.

Referring to FIG. 46, a top package 3 is electrically connected to the outer pillars 27. In one embodiment, the top package 3 is electrically connected to the outer pillars 27 and the semiconductor device 25 through the inner solders 35 and the wiring structure 4. In addition, a middle encapsulant 36 may be formed or disposed in the space between the top substrate 30 and the wiring structure 4 to cover and protect the inner solders 35. Then, a singulation process is conducted, and the fourth supporting carrier 45 (or the second carrier) and the adhesive layer 44 are removed so to form a plurality of semiconductor package structures 2a of FIG. 5.

Figure 47:
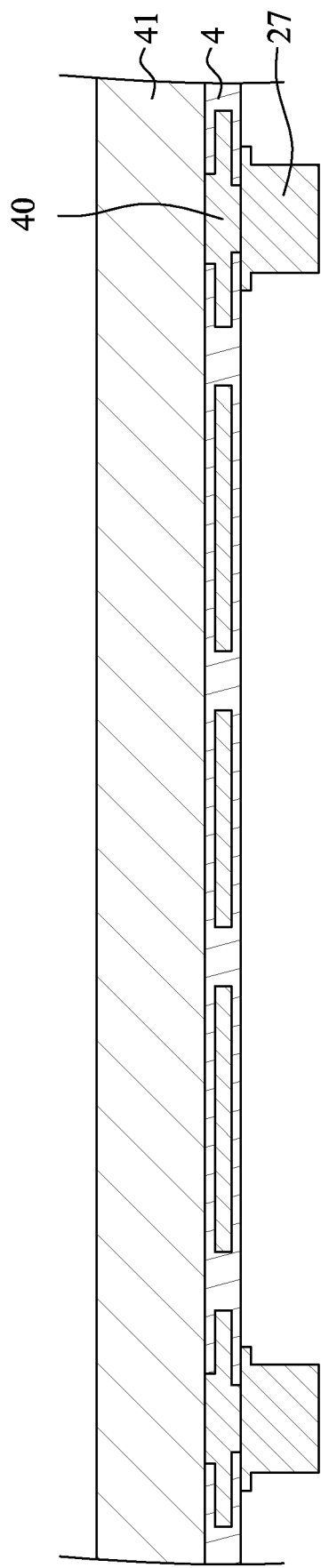
FIG. 47 illustrates one or more stages of an example of a method for manufacturing a semiconductor package structure according to some embodiments of the present disclosure.

FIG. 47 through FIG. 57 illustrate a method for manufacturing a semiconductor package structure according to some embodiments of the present disclosure. In some embodiments, the method is for manufacturing the semiconductor package structure 2b shown in FIG. 6. The initial stages of the illustrated process are the same as, or similar to, the stages illustrated in FIG. 23 to FIG. 26. FIG. 47 depicts a stage subsequent to that depicted in FIG. 26.

Referring to FIG. 47, a plurality of outer pillars 27 are formed on the wiring structure 4.

Figure 48:
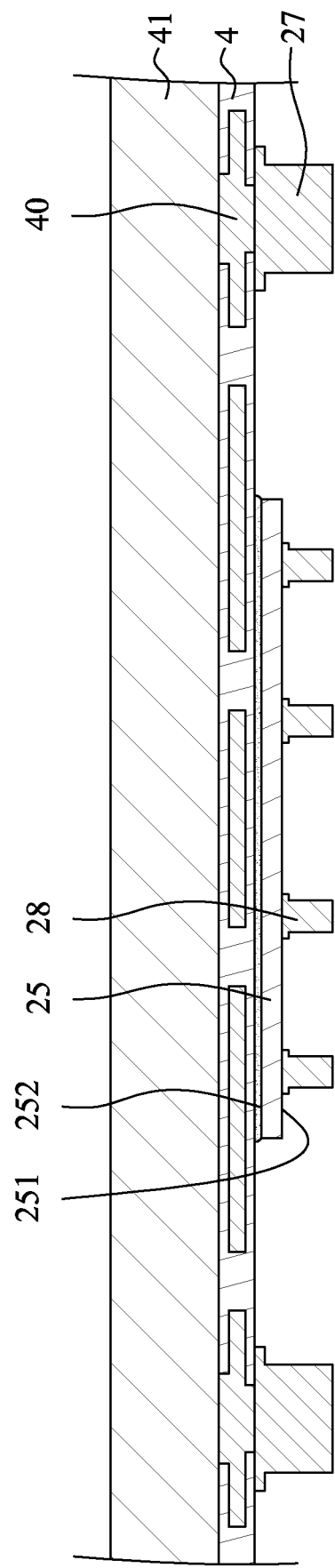
FIG. 48 illustrates one or more stages of an example of a method for manufacturing a semiconductor package structure according to some embodiments of the present disclosure.

Referring to FIG. 48, a second surface 252 of a semiconductor device 25 is adhered to the wiring structure 4. The outer pillars 27 are disposed around the semiconductor device 25. Then, a plurality of inner pillars 28 are formed on the first surface 251 of the semiconductor device 25. In some embodiments, the inner pillars 28 may be formed on the first surface 251 of the semiconductor device 25 firstly; then, the second surface 252 of the semiconductor device 25 is adhered to the wiring structure 4.

Figure 49:
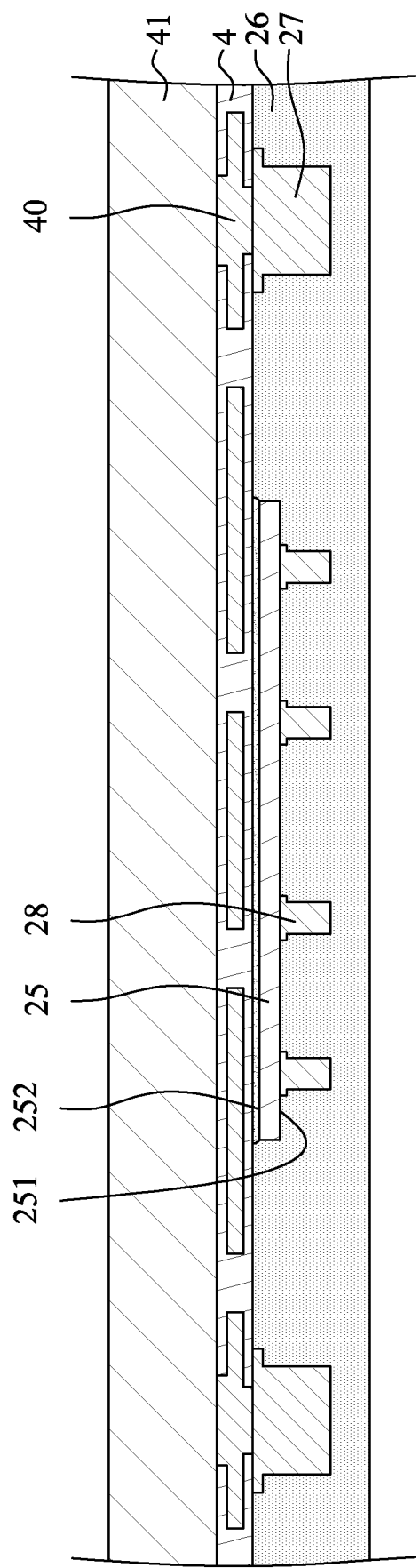
FIG. 49 illustrates one or more stages of an example of a method for manufacturing a semiconductor package structure according to some embodiments of the present disclosure.

Referring to FIG. 49, an encapsulant 26 is formed to cover the semiconductor device 25, the wiring structure 4, the inner pillars 28 and the outer pillars 27.

Figure 50:
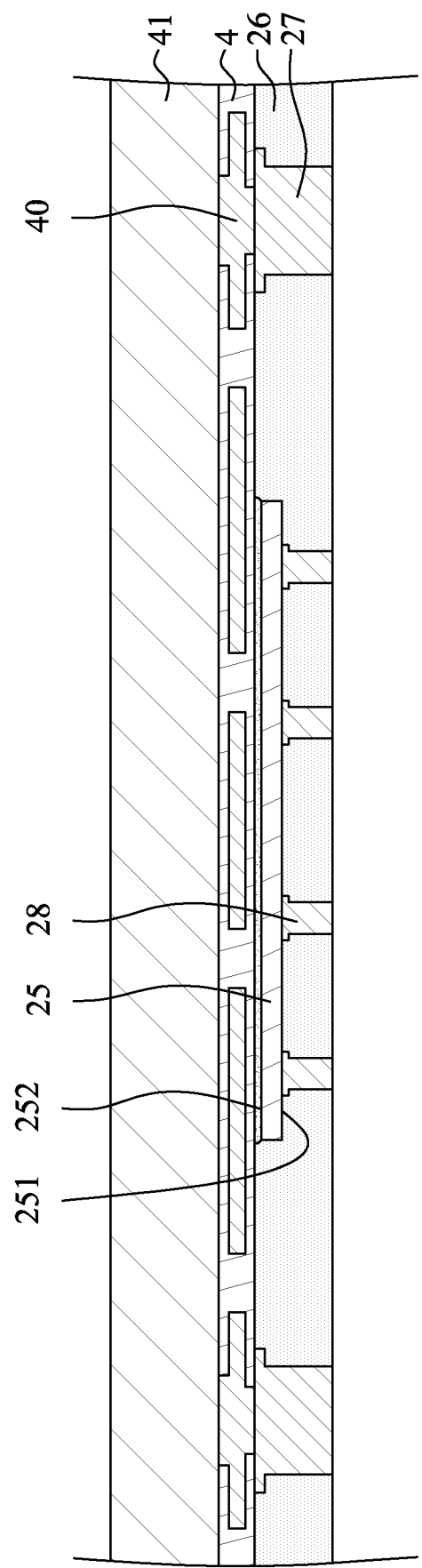
FIG. 50 illustrates one or more stages of an example of a method for manufacturing a semiconductor package structure according to some embodiments of the present disclosure.

Referring to FIG. 50, the encapsulant 26 is thinned from its bottom surface by, for example, grinding. Meanwhile, the bottom surface of the encapsulant 26, the bottom surfaces of the outer pillars 27 and the bottom surfaces of the inner pillars 28 are substantially coplanar with each other.

Figure 51:
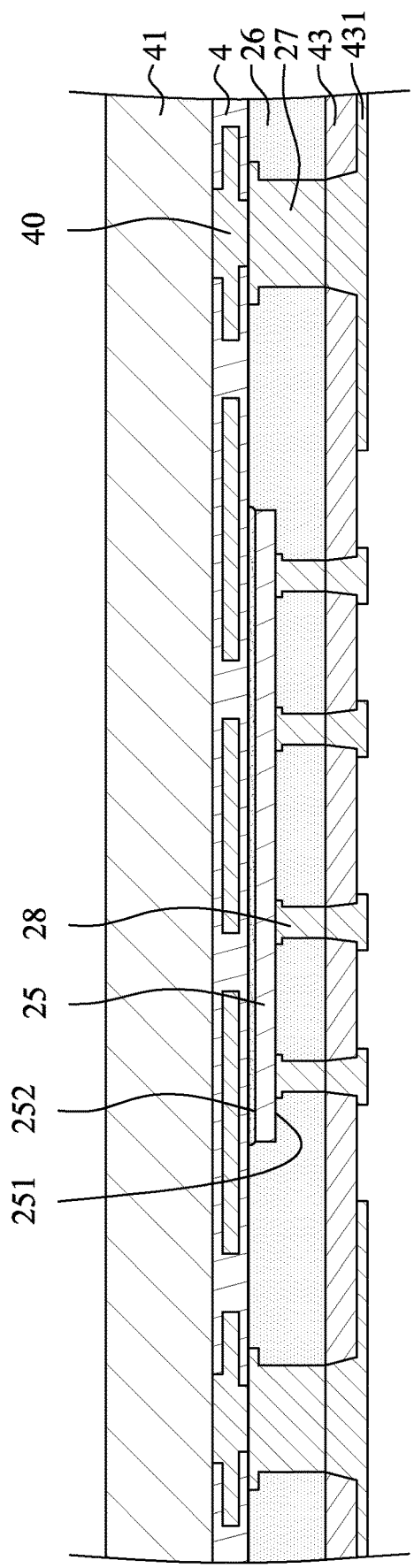
FIG. 51 illustrates one or more stages of an example of a method for manufacturing a semiconductor package structure according to some embodiments of the present disclosure.

Referring to FIG. 51, a middle redistribution structure 43 (including a redistribution layer (RDL) 431) is formed or disposed on the encapsulant 26 to electrically connect the outer pillars 27 and the inner pillars 28.

Figure 52:
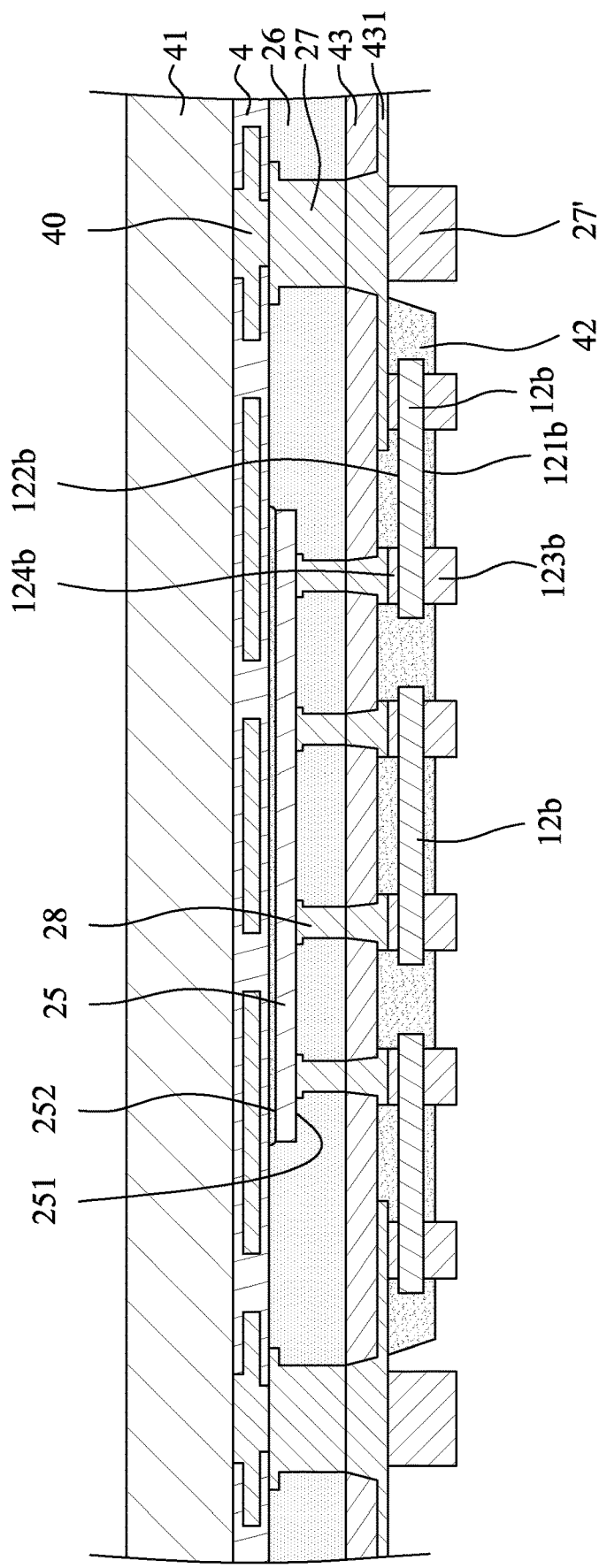
FIG. 52 illustrates one or more stages of an example of a method for manufacturing a semiconductor package structure according to some embodiments of the present disclosure.

Referring to FIG. 52, at least one capacitor 12b is disposed on and electrically connected to the middle redistribution structure 43. The second electrodes 124b of the capacitor 12b are electrically connected to the redistribution layer (RDL) 431 of the middle redistribution structure 43. Thus, the capacitor 12b may be electrically connected to the semiconductor device 25 and the outer pillars 27. Then, a bottom protection material 42 (e.g., an underfill) is formed or disposed on the middle redistribution structure 43 to cover and protect the capacitor 12b. It is noted that an area of the bottom protection material 42 from a top view is greater than the area of the semiconductor device 25 from a top view. Then, a plurality of outer pillars 27' are formed or disposed on the redistribution layer (RDL) 431 of the middle redistribution structure 43. The outer pillars 27' are disposed around the capacitor 12b and the underfill 42.

Figure 53:
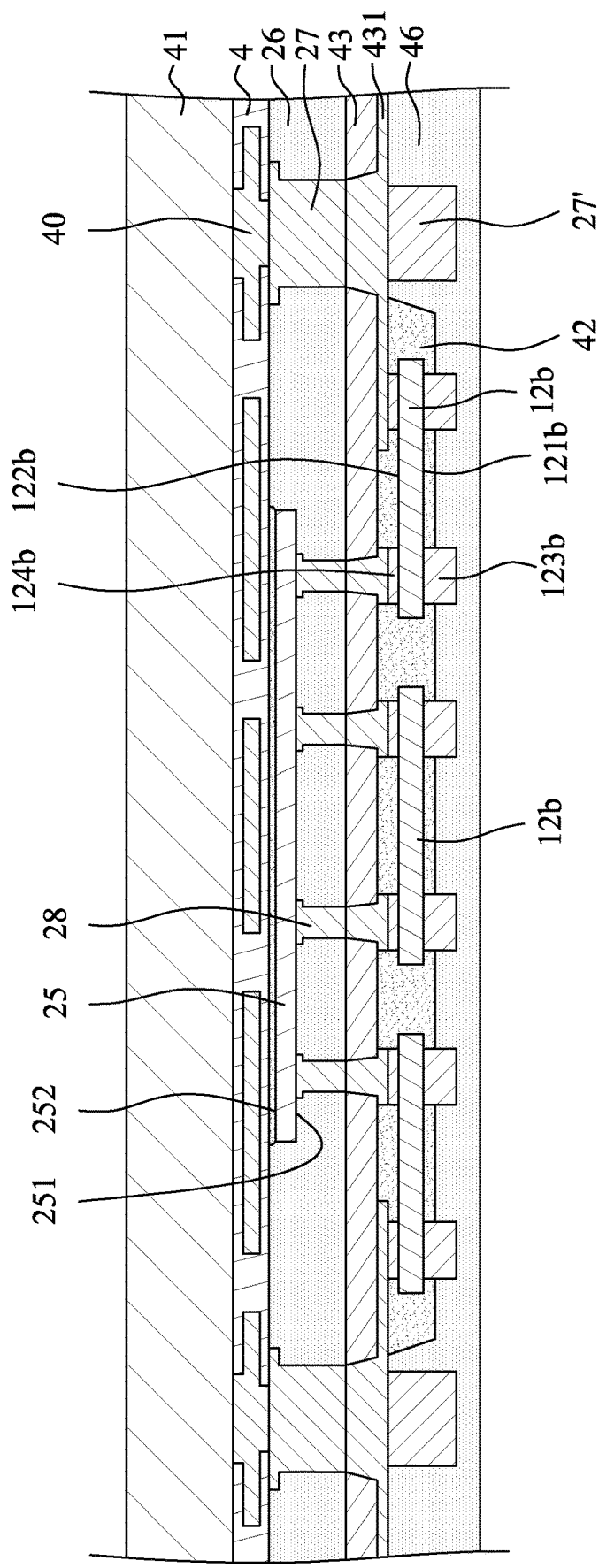
FIG. 53 illustrates one or more stages of an example of a method for manufacturing a semiconductor package structure according to some embodiments of the present disclosure.

Referring to FIG. 53, an insulation layer 46 is formed or disposed on the middle redistribution structure 43 to cover the bottom protection material 42, the sidewalls of the first electrodes 123b of the capacitor 12b, and the outer pillars 27'.

Figure 54:
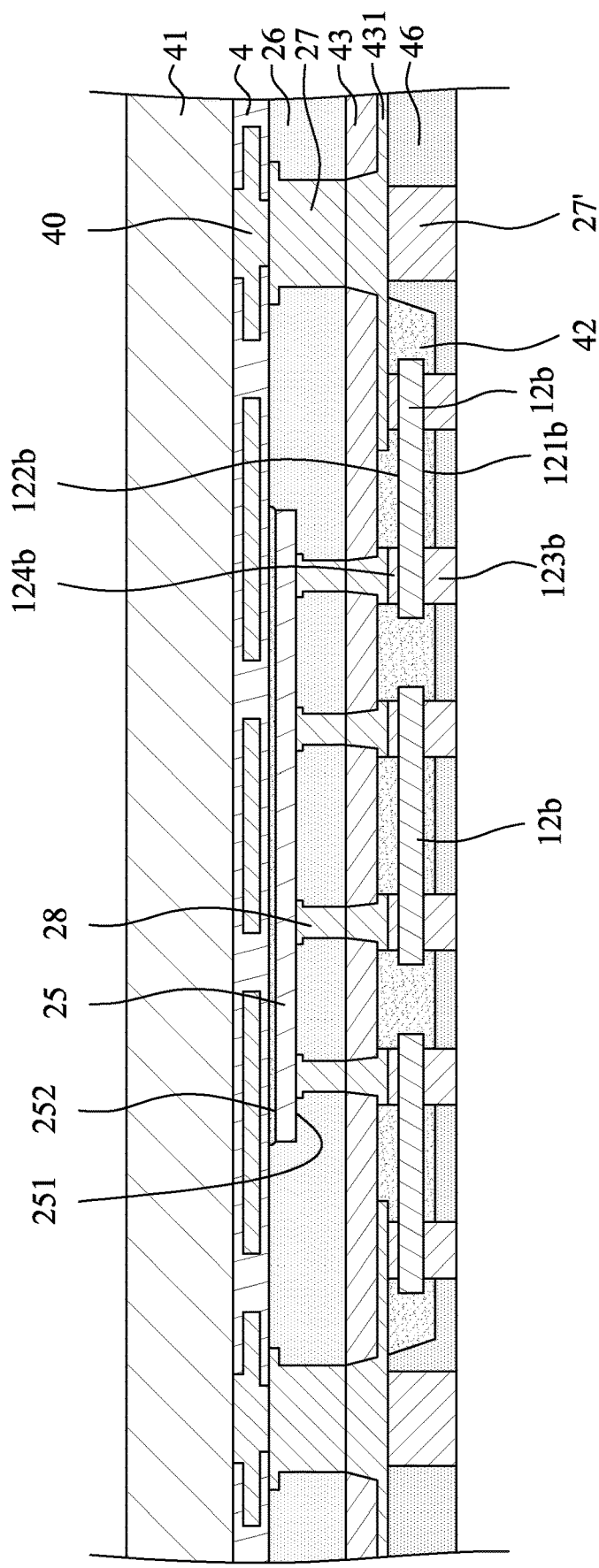
FIG. 54 illustrates one or more stages of an example of a method for manufacturing a semiconductor package structure according to some embodiments of the present disclosure.

Referring to FIG. 54, the insulation layer 46 is thinned from its bottom surface by, for example, grinding. Meanwhile, the bottom surface of the insulation layer 46, the bottom surfaces of the first electrodes 124b of the capacitor 12b and the bottom surfaces of the outer pillars 27' are substantially coplanar with each other.

Figure 55:
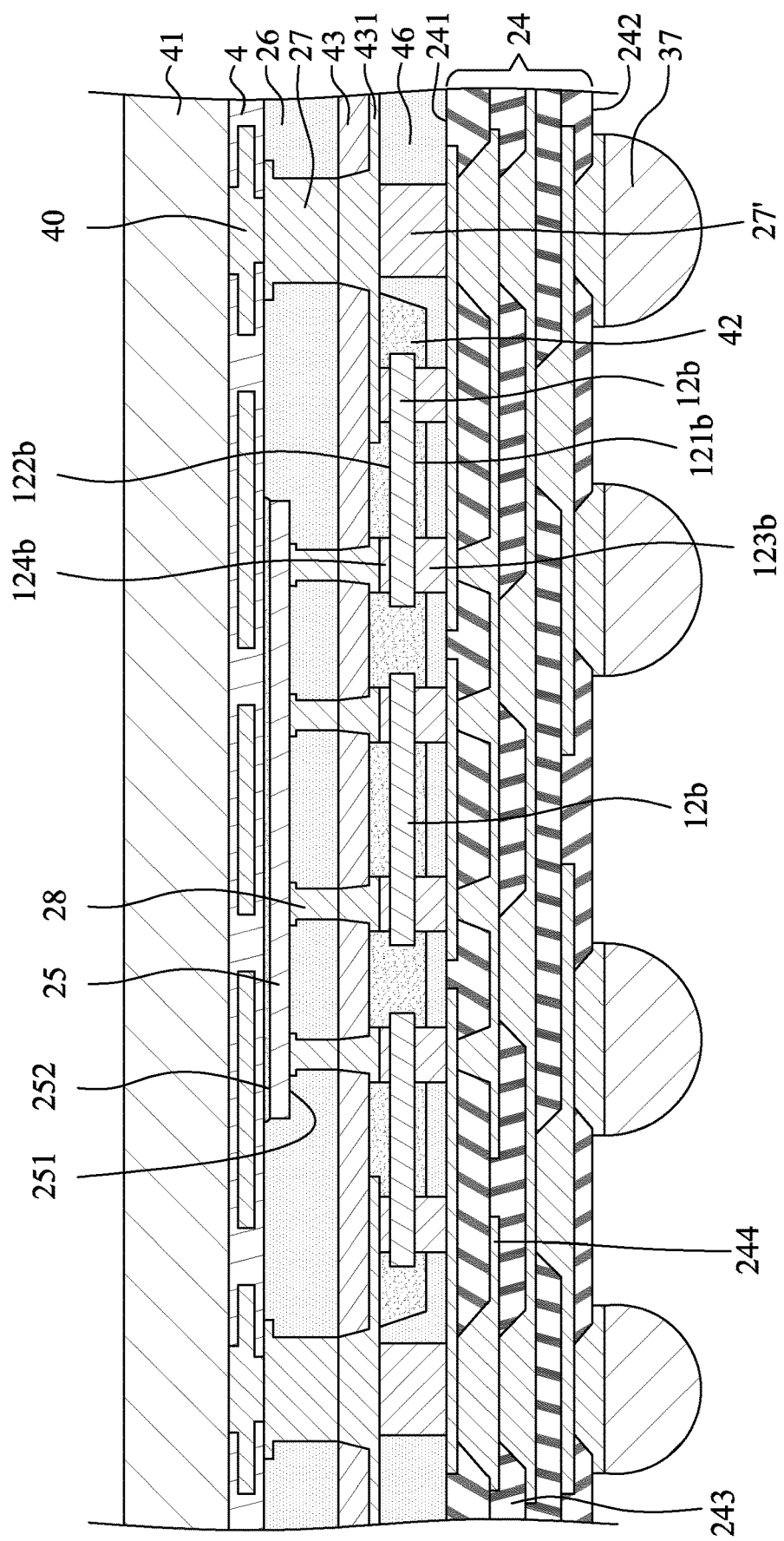
FIG. 55 illustrates one or more stages of an example of a method for manufacturing a semiconductor package structure according to some embodiments of the present disclosure.

Referring to FIG. 55, a conductive structure 24 is formed or disposed on the insulation layer 46 and electrically connected to the first electrodes 123b of the capacitor 12b and the outer pillars 27'. In one embodiment, the conductive structure 24 may include four dielectric layers 243 and four metal circuit layers 244. Then, a plurality of solder bumps 37 are formed on the second surface 242 of the conductive structure 24.

Figure 56:
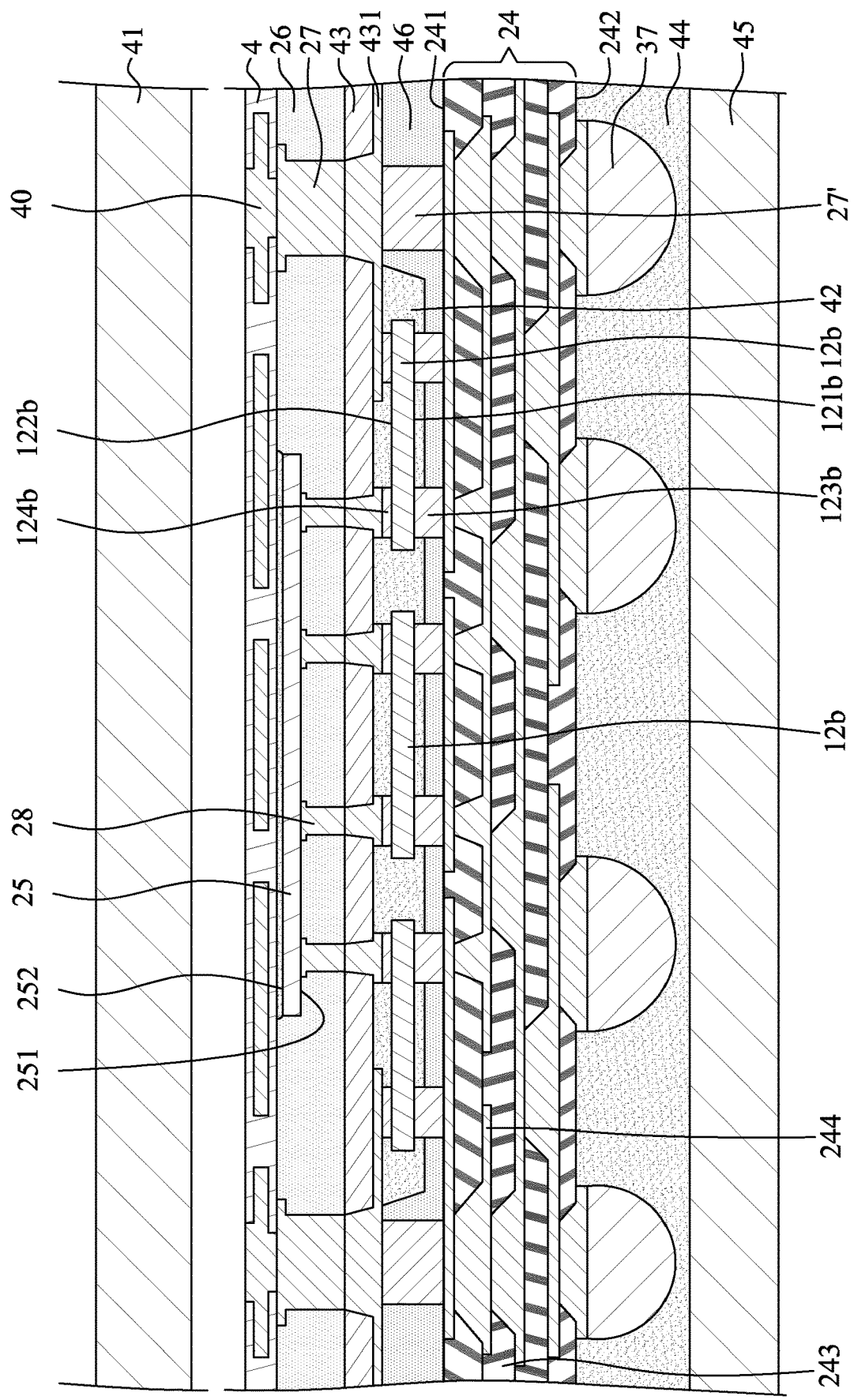
FIG. 56 illustrates one or more stages of an example of a method for manufacturing a semiconductor package structure according to some embodiments of the present disclosure.

Referring to FIG. 56, a fourth supporting carrier 45 (or a second carrier) is attached to the second surface 242 of the conductive structure 24 through an adhesive layer 44. Then, the third supporting carrier 41 (or the first carrier) is removed.

Figure 57:
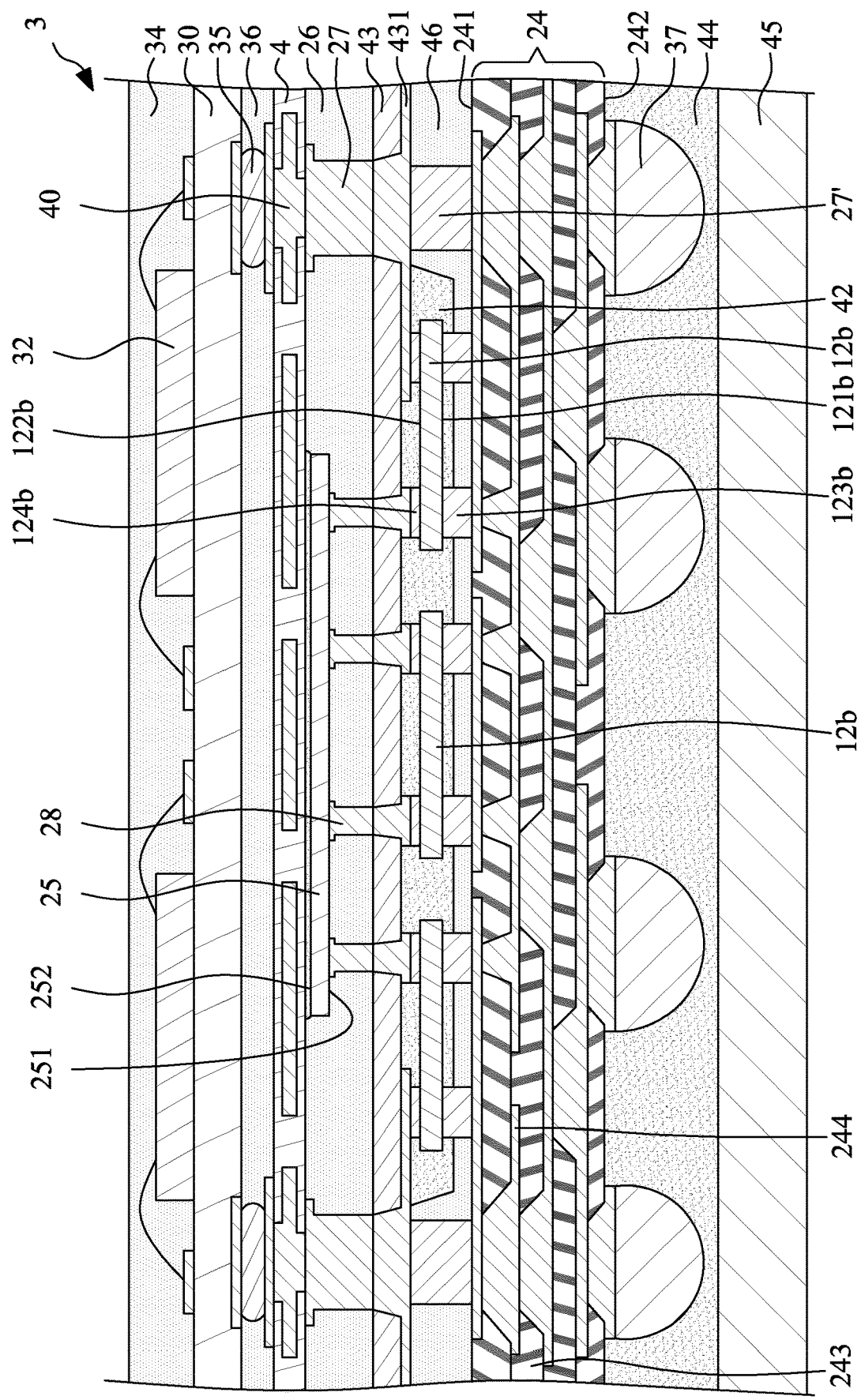
FIG. 57 illustrates one or more stages of an example of a method for manufacturing a semiconductor package structure according to some embodiments of the present disclosure.

Referring to FIG. 57, a top package 3 is electrically connected to the outer pillars 27. In one embodiment, the top package 3 is electrically connected to the outer pillars 27 and the semiconductor device 25 through the inner pillars 35 and the wiring structure 4. In addition, a middle encapsulant 36 may be formed or disposed in the space between the top substrate 30 and the wiring structure 4 to cover and protect the inner solders 35. Then, a singulation process is conducted, and the fourth supporting carrier 45 (or the second carrier) and the adhesive layer 44 are removed so to form a plurality of semiconductor package structures 2b of FIG. 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A capacitor bank structure, comprising:
   at least two capacitors physically separated from each other by a first protection material disposed therebetween, wherein each of the capacitors has a first surface and a second surface opposite to the first surface, and includes a plurality of first electrodes disposed on and protruding from the first surface thereof for external connection and a plurality of second electrodes disposed adjacent to the second surface thereof for external connection, wherein the first protection material encapsulates a lateral surface and the second surface of each of the capacitors, and includes a plurality of openings to expose the plurality of second electrodes respectively; and
   a conductive pad extending into the first protection material from a level above a top surface of the first protection material to electrically connect one of the plurality of second electrodes, wherein the conductive pad is electrically connected to the one of the plurality of second electrodes through a soldering material, wherein the soldering materials are disposed in the first protection material.

* * * * *